US012812880B2

(12) United States Patent
Chou et al.

(10) Patent No.: US 12,812,880 B2

(45) Date of Patent: Nov. 24, 2026

(54) INDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Wei-Yu Chou, Taichung City (TW); Yang-Che Chen, Hsin-Chu City (TW); Chi-Hui Lai, Taichung City (TW); Yi-Lun Yang, Taoyuan City (TW); Hsiang-Tai Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 524 days.

(21) Appl. No.: 18/154,043

(22) Filed: Jan. 13, 2023

(65) Prior Publication Data

US 2024/0243163 A1 Jul. 18, 2024

(51) Int. Cl.

| | |
|---|---|
| ***H10D 1/20*** | (2025.01) |
| ***H01F 27/06*** | (2006.01) |
| ***H01F 27/24*** | (2006.01) |
| ***H01F 41/02*** | (2006.01) |

(52) U.S. Cl.

CPC ............... *H10D 1/20* (2025.01); *H01F 27/06* (2013.01); *H01F 27/24* (2013.01); *H01F 41/0206* (2013.01)

(58) Field of Classification Search

None

See application file for complete search history.

(56) References Cited

U.S. PATENT DOCUMENTS

2001/0050607 A1* 12/2001 Gardner .............. H01F 17/0006 336/200
2005/0052938 A1* 3/2005 Horikoshi .............. B82Y 10/00 257/E27.005
2009/0050992 A1* 2/2009 Kools .................... H10N 50/01 257/422
2013/0093032 A1* 4/2013 Webb ...................... H10D 1/20 257/E29.323
2015/0255529 A1* 9/2015 Wang ...................... H10D 1/20 438/3
2015/0287772 A1* 10/2015 Wang ...................... H10D 1/20 257/531

* cited by examiner

*Primary Examiner* — Bilkis Jahan

(74) *Attorney, Agent, or Firm* — WPAT LAW; Anthony King

(57) ABSTRACT

The present disclosure provides a semiconductor structure including a vertical inductor. The semiconductor structure includes a first semiconductor substrate, a first conductive layer, a first magnetic layer, and a second magnetic layer. The first semiconductor substrate has a top surface, and the first conductive layer is vertically inserted into the first semiconductor substrate from the top surface of the first semiconductor substrate. The first magnetic layer is disposed in the first semiconductor substrate and surrounds the first conductive layer. The second magnetic layer is disposed over the first conductive layer and the first magnetic layer.

20 Claims, 36 Drawing Sheets

102

201

203

INDUCTOR STRUCTURE AND METHOD FOR MANUFACTURING THE SAME

BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, a bottleneck in reduction of chip size without reduction of numbers of electrical elements formed on the chips has been encountered.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, dimensions of the various features may be arbitrarily increased or reduced for clarity of discussion.

DETAILED DESCRIPTION

Figure 1:
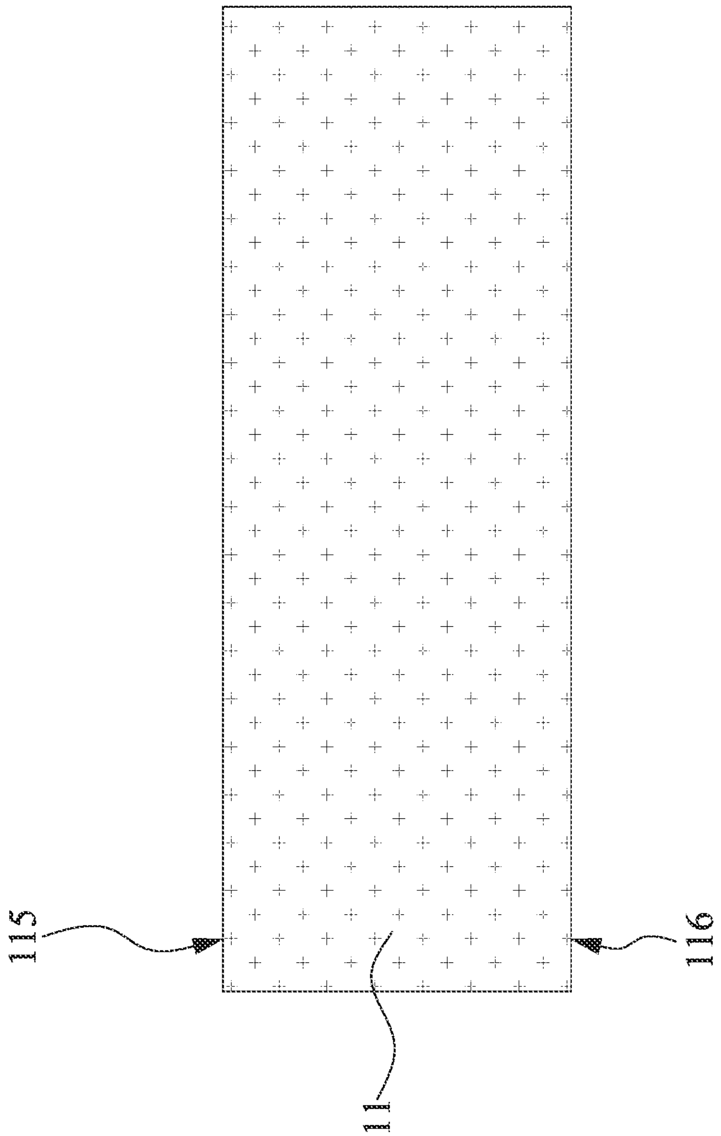
FIGS. 1 to 8 are schematic cross-sectional diagrams at different stages of a method of manufacturing a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as “first,” “second” and “third” describe various elements, components, regions, layers and/or sections, these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context. In addition, the term “source/drain region” or “source/drain regions” may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A conventional inductor is formed over a semiconductor wafer, which includes a circuit formed therewithin. The conventional inductor is formed over an interconnect structure of the semiconductor wafer. The conventional inductor includes metal lines horizontally arranged and disposed along a surface of the semiconductor wafer. For instance, the metal lines of the conventional inductor are formed by a deposition over the surface of the semiconductor wafer and a patterning operation to define the metal lines arranged in a horizontal direction. In addition, the conventional inductor includes a polymeric material surrounding and separating the metal lines. Due to limitations of manufacturing process and dimensions and distances of different elements of an inductor for proper functioning, a size of the conventional inductor over the semiconductor wafer cannot be further reduced.

The present disclosure provides an inductor including conductive materials in a vertical arrangement so as to reduce a size of the inductor over a substrate. A semiconductor structure including the inductor and a method for manufacturing the same are also provided. FIGS. 1 to 34 are schematic cross-sectional diagrams of semiconductor structures at different stages of the method according to different embodiments or different perspectives. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Referring to FIG. 1, a substrate 11 is provided, formed or received. In some embodiments, the substrate 11 includes a bulk semiconductor material, such as silicon. In some embodiments, the substrate 11 is a raw wafer. The substrate 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof. The substrate 11 may include a first surface 115 (e.g., a top surface) and a second surface 116 (e.g., a bottom surface) opposite to the first surface 115.

Figure 2:
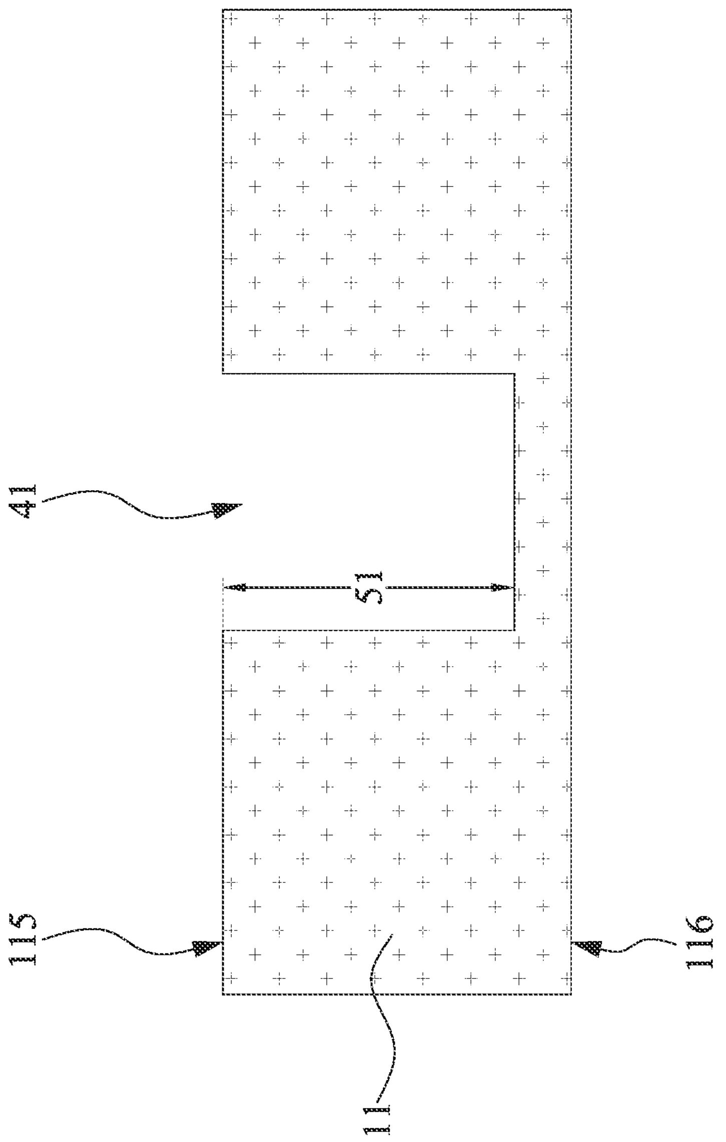

Referring to FIG. 2, a portion of the substrate 11 is removed, and an opening 41 is formed in the substrate 11. The opening 41 may be formed on the first surface 115 of the substrate 11. In some embodiments, the formation of the opening 41 includes formation of a photoresist layer over the first surface 115 of the substrate 11 followed by an etching operation. In some embodiments, the etching operation includes a dry etching operation, a wet etching operation or a combination thereof. In some embodiments, the dry etching operation includes an ion beam etching, a reactive ion etching, or a combination thereof. In some embodiments, a depth 51 of the opening 41 is in a range of 50 to 130 microns (μm).

Figure 3:
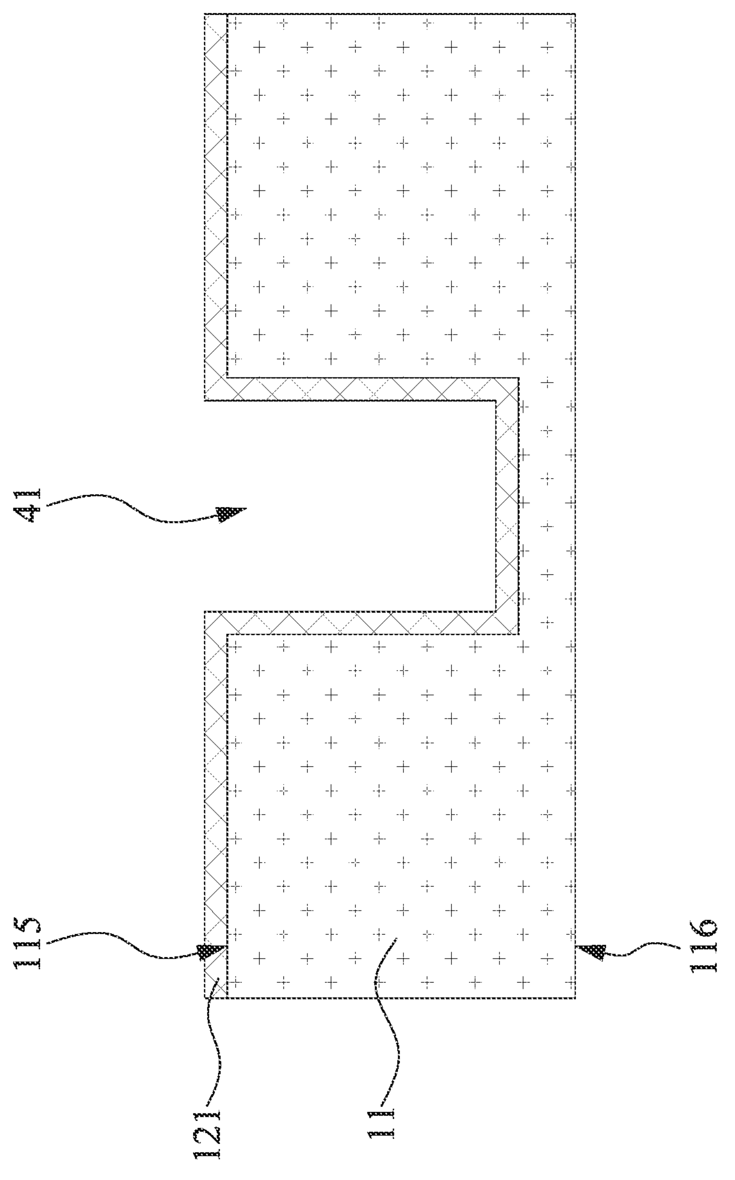

Referring to FIG. 3, a dielectric layer 121 is formed over the substrate 11. In some embodiments, the dielectric layer 121 is formed by a deposition. The dielectric layer 121 may be conformal to the substrate 11 over the first surface 115 of the substrate 11. In some embodiments, a thickness of the dielectric layer 121 is consistent across the substrate 11. The dielectric layer 121 lines the opening 41 over the substrate 11. A thickness of the dielectric layer 121 is not limited as long as a magnetic layer 13 (formed in subsequent processing) can be isolated from the substrate 11. In some embodiments, the thickness of the dielectric layer 121 is in a range of 1 to 20 μm. The dielectric layer 121 can include a suitable dielectric material, such as silicon oxide ($SiO_x$), silicon nitride ($Si_xN_y$), silicon oxynitride (SiON), other low-k dielectric materials, high-k dielectric materials, or a combination thereof.

Figure 4:
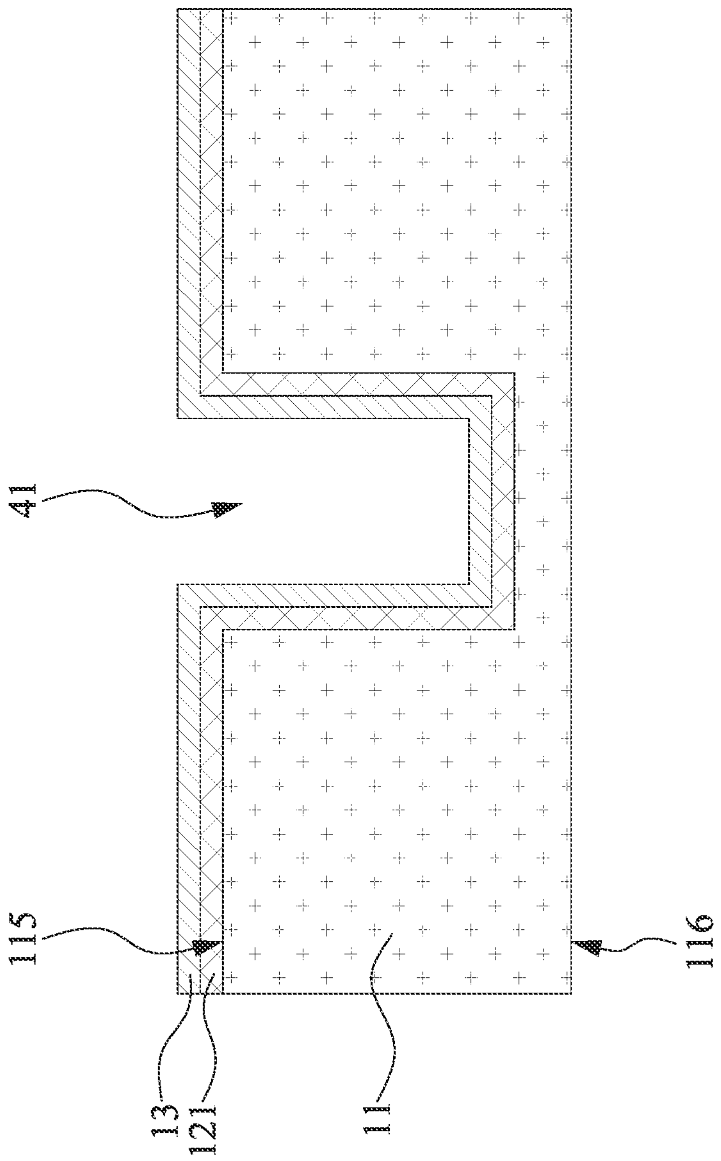

Referring to FIG. 4, the magnetic layer 13 is formed over the dielectric layer 121 in the opening 41. In some embodiments, the magnetic layer 13 is formed by a deposition. In some embodiments, the deposition includes a plating operation. The magnetic layer 13 may be conformal to the dielectric layer 121 over the first surface 115 of the substrate 11. In some embodiments, a thickness of the magnetic layer 13 is consistent across the substrate 11. The magnetic layer 13 may line the opening 41 over the substrate 11. A thickness of the magnetic layer 13 can be adjusted according to a designed electrical property of a device. In some embodiments, the thickness of the magnetic layer 13 is in a range of 1 to 10 μm. In some embodiments, the thickness of the magnetic layer 13 is less than the thickness of the dielectric layer 121. The magnetic layer 13 can include a suitable magnetically conductive material. In some embodiments, the magnetically conductive material includes iron, cobalt, nickel, samarium, neodymium, stainless steel, or a combination thereof.

Figure 5:
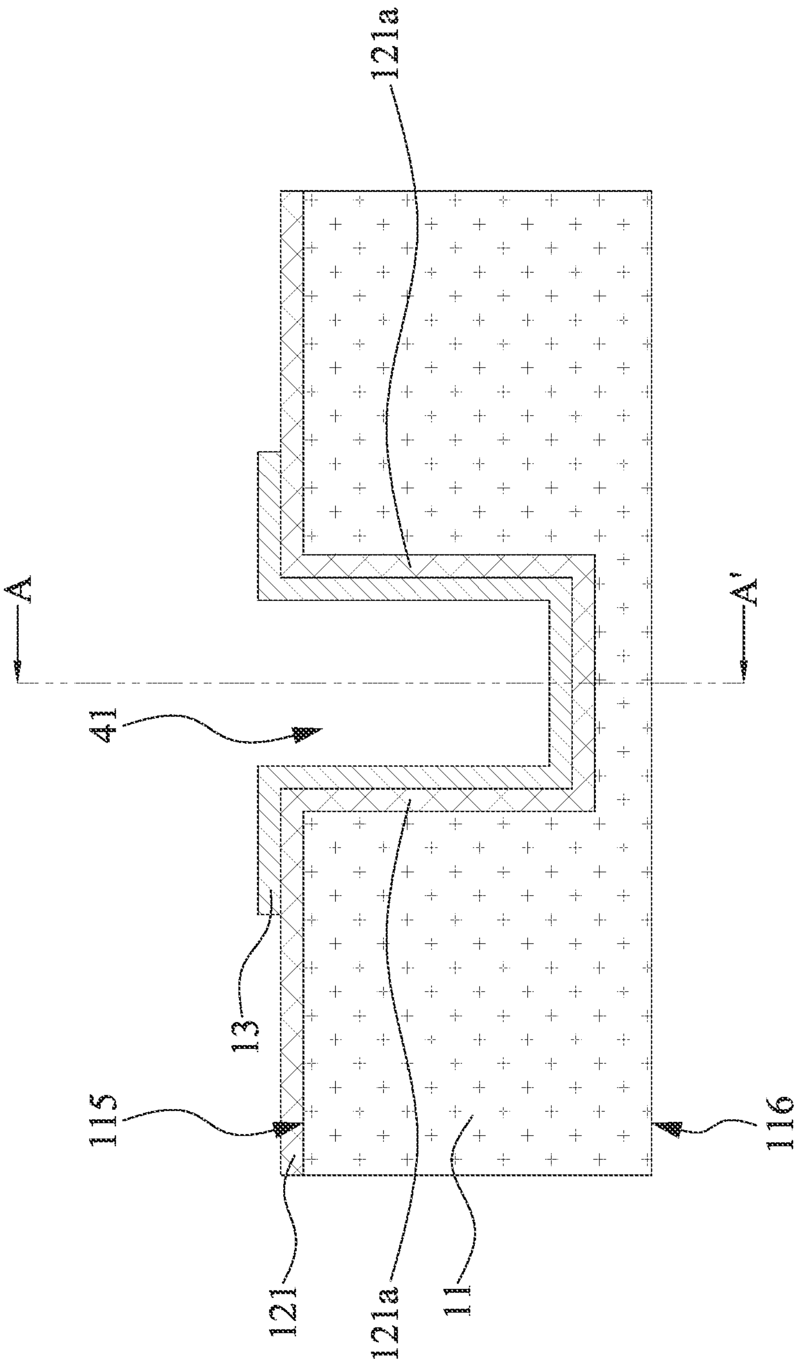
Figure 6:
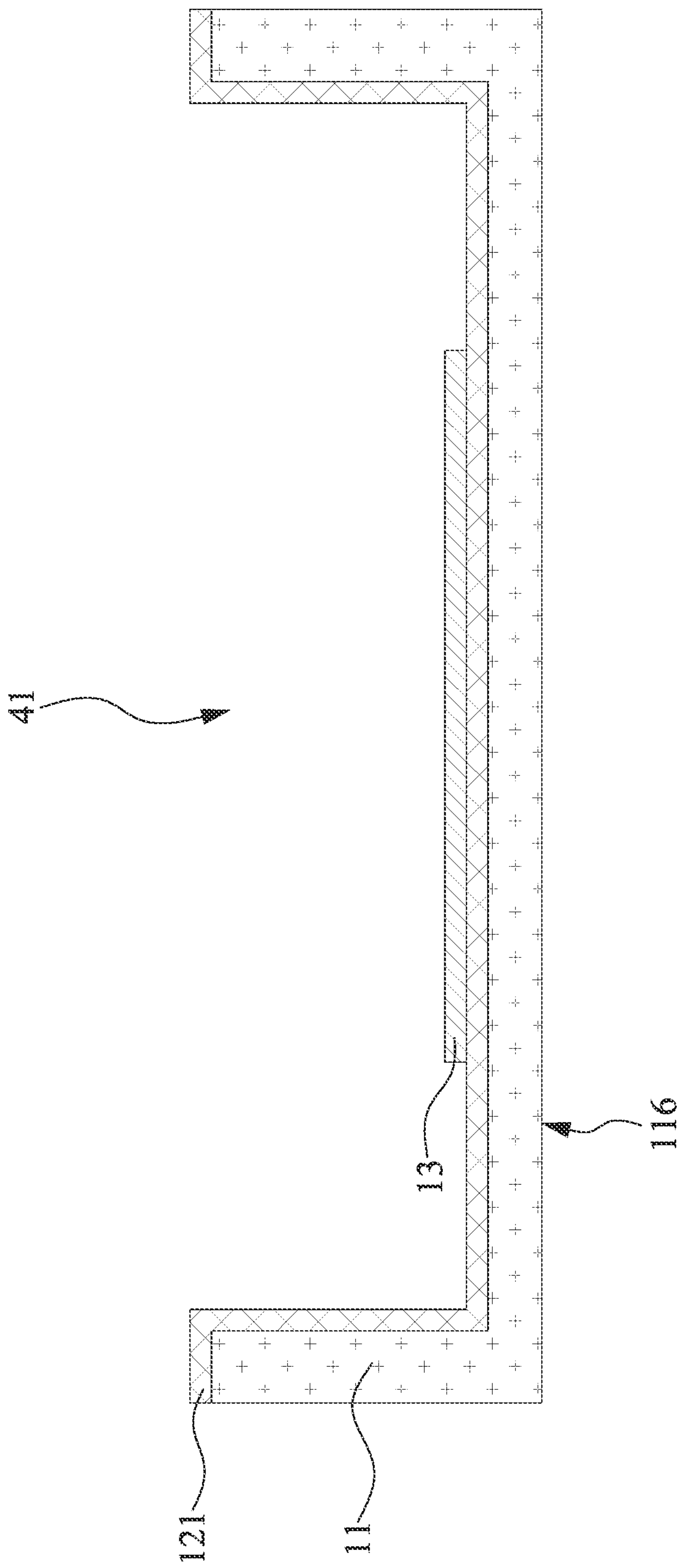

Referring to FIGS. 5 and 6, the magnetic layer 13 is patterned. In some embodiments, FIG. 6 is a cross section of the intermediate structure of FIG. 5 along a line A-A' in FIG. 5. In some embodiments, a portion of the magnetic layer 13 outside the opening 41 or above the first surface 115 of the substrate is removed. In some embodiments, the magnetic layer 13 extends along the dielectric layer 121 above the opening 41 by a distance greater than zero to ensure vertical portions 121*a* of the dielectric layer 121 on sidewalls of the opening 41 are covered by the magnetic layer 13 as shown in the cross section of FIG. 5. A portion of the magnetic layer 13 in the opening 41 may be also removed. In some embodiments, the magnetic layer 13 lines only a portion of the opening 41 as shown in the cross section in FIG. 6. In some embodiments, the magnetic layer 13 lines a central portion of the opening 41. In some embodiments, the magnetic layer 13 exposes portions of the dielectric layer 121 lining the opening 41 as shown in FIG. 6.

Figure 7:
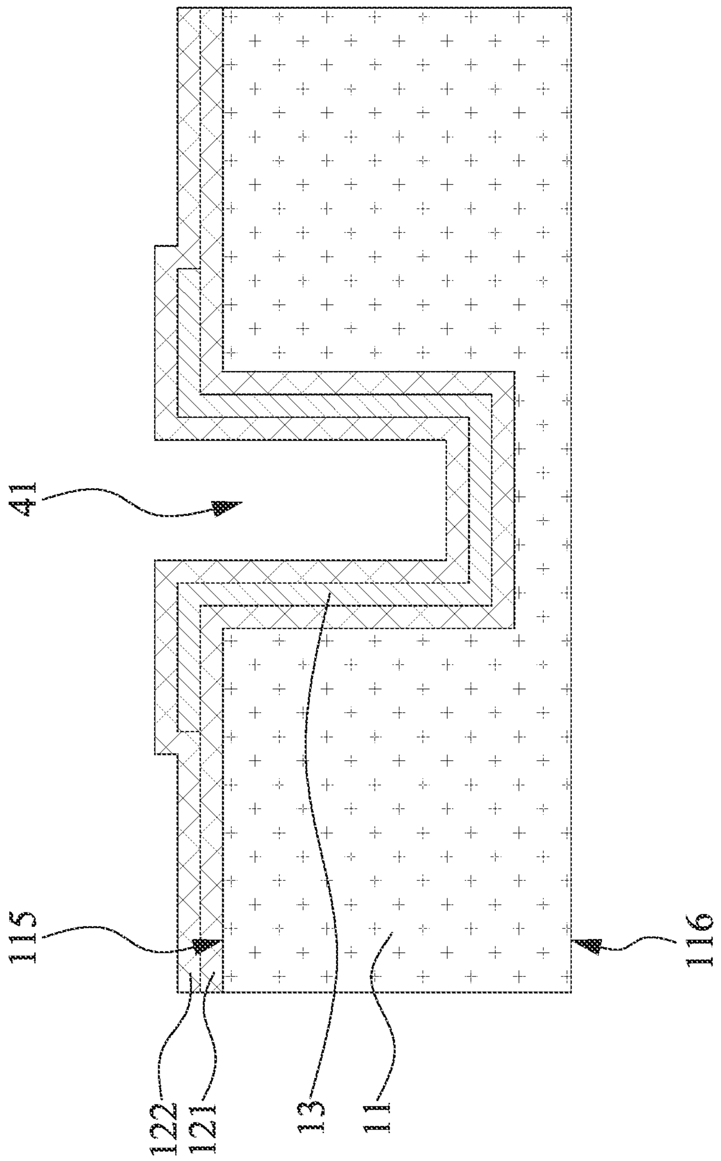

Referring to FIG. 7, a dielectric layer 122 is formed over the substrate 11. The dielectric layer 122 covers the magnetic layer 13 and the dielectric layer 121. In some embodiments, the dielectric layer 122 is formed by a deposition. The dielectric layer 122 may be conformal to a profile of the magnetic layer 13 and the dielectric layer 121. In some embodiments, the dielectric layer 122 covers an entirety of the magnetic layer 13. In some embodiments, a thickness of the dielectric layer 122 is consistent across the substrate 11. The dielectric layer 122 lines the magnetic layer 13 in the opening 41. A thickness of the dielectric layer 122 can be adjusted according to a designed electrical property of a device. In some embodiments, the thickness of the dielectric layer 122 is less than 10 μm. The dielectric layer 122 can include a suitable dielectric material, such as one of the dielectric materials listed for the dielectric layer 122. In some embodiments, the dielectric layers 121 and 122 include a same dielectric material.

Figure 8:
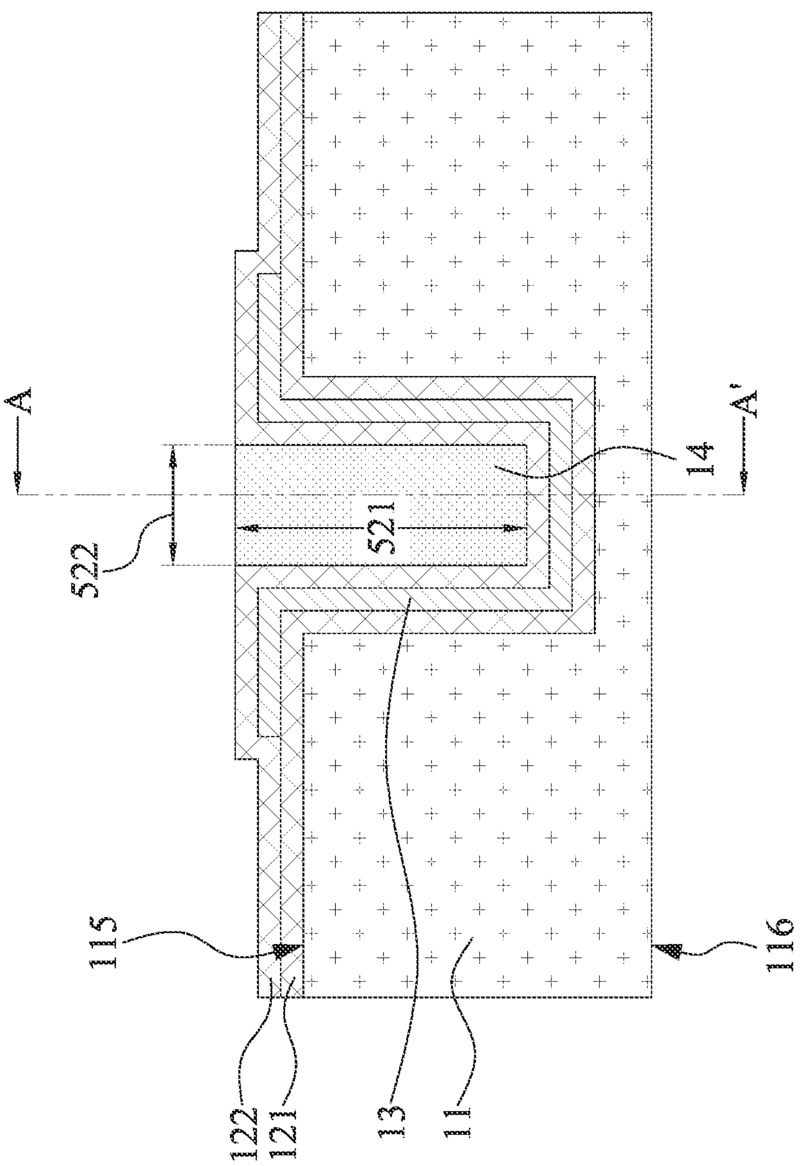
Figure 9:
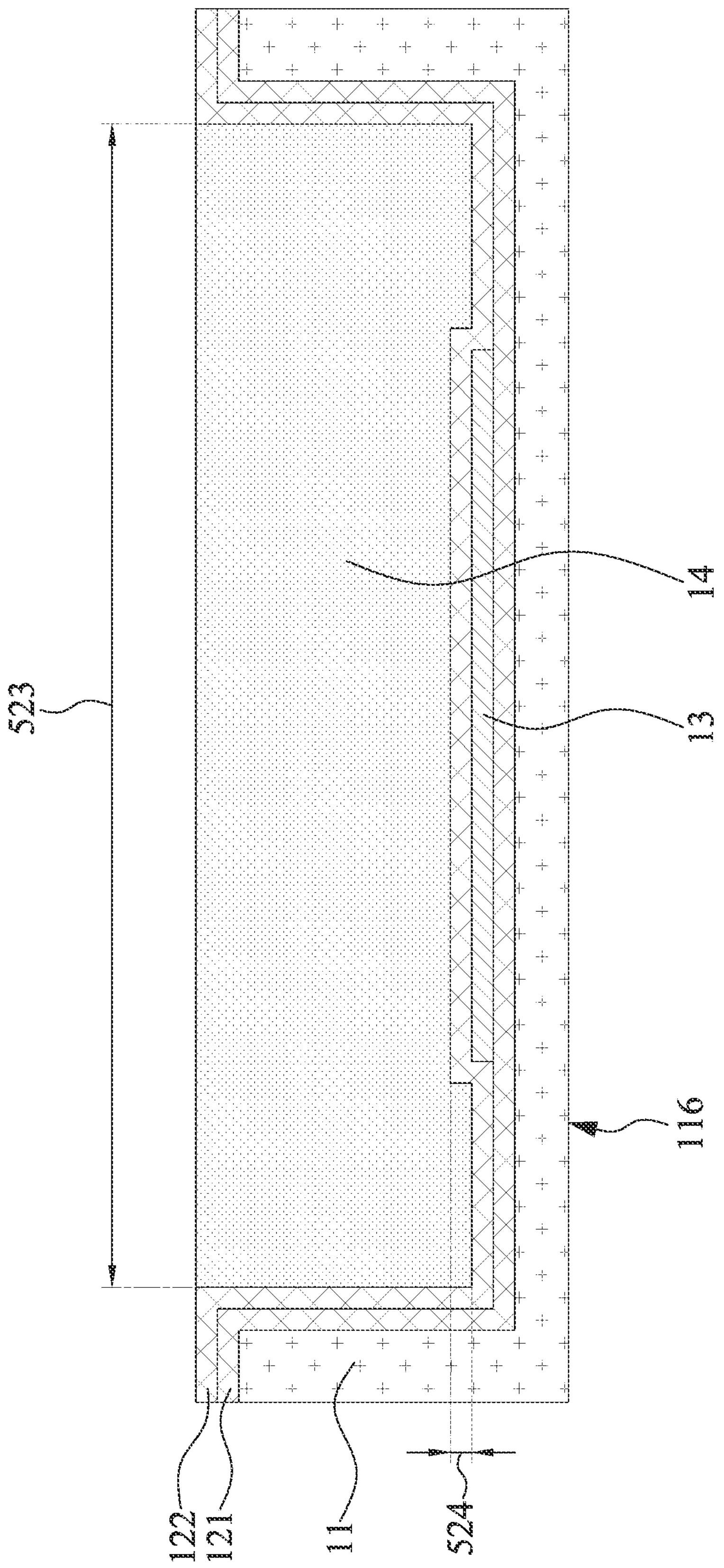
FIG. 9 is a schematic cross-sectional diagram along a line A-A' in FIG. 8 in accordance with some embodiments of the disclosure.

Referring to FIGS. 8 and 9, a conductive layer 14 is formed over the substrate 11 in the opening 41, wherein FIG. 9 is a cross section of the intermediate structure of FIG. 8 along the line A-A' in FIG. 8. In some embodiments, the conductive layer 14 is formed by a deposition. In some embodiments, the deposition includes a plating operation. A planarization can be performed after the deposition, and a top surface of the conductive layer 14 can be substantially aligned or coplanar with a top surface of the dielectric layer 122. In some embodiments, the planarization includes an etching operation. The etching operation can include a dry etch (such as ion beam etch, plasma etch and reactive ion etch), a wet etch, or a combination thereof. In some embodiments, the planarization includes a polishing operation (e.g., a chemical-mechanical polishing operation, or CMP) followed by the etching operation. The planarization may stop on an exposure of the dielectric layer 122.

In some embodiments, a depth 521 of the conductive layer 14 shown in FIG. 8 is in a range of 20 to 80 μm. In some embodiments, a width 522 of the conductive layer 14 shown in FIG. 8 is in a range of 10 to 40 μm. In some embodiments, a length 523 of the conductive layer 14 shown in FIG. 9 is in a range of 100 to 2000 μm. It should be noted that the depth 521, the width 522, and the length 523 can be adjusted according to the opening 41 depending on different applications. In addition, depths of the conductive layer 14 in a peripheral region and in a central region may have a difference 524 due to the magnetic layer 13. However, the difference 524 can be small and is omitted in the following description for a purpose of ease of illustration. In some embodiments, the top surface of the conductive layer 14 is exposed, and the rest of the conductive layer 14 is entirely surrounded by the dielectric layer 122. In some embodiments, the conductive layer 14 is partially surrounded by the magnetic layer 13.

Figure 10:
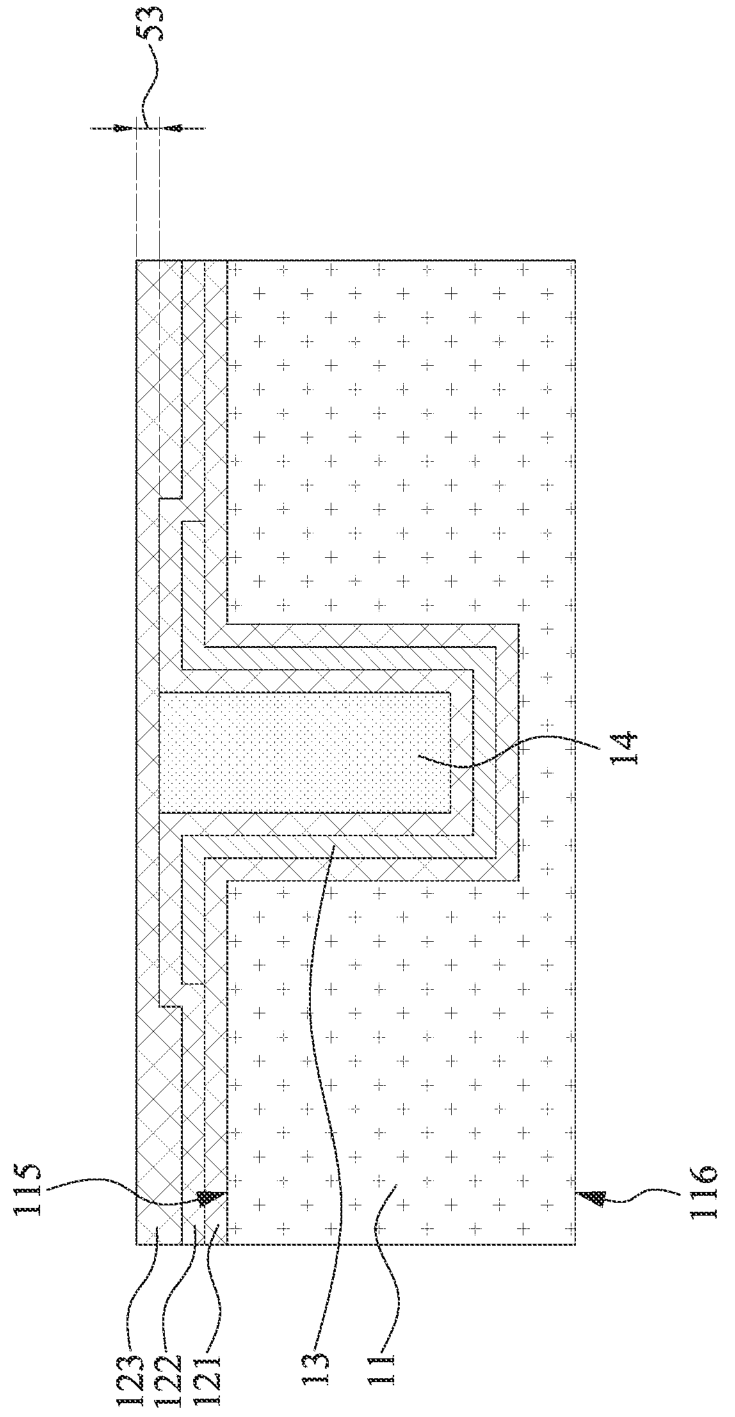
FIGS. 10 to 15 are schematic cross-sectional diagrams at different stages of a method of manufacturing a semiconductor structure in accordance with some embodiments of the disclosure.

Referring to FIG. 10, a dielectric layer 123 is formed over the dielectric layer 122 and the conductive layer 14. The dielectric layer 123 may include a dielectric material same as or different from those of the dielectric layers 122 or 121. In some embodiments, the dielectric layer 123 is formed by a deposition. A planarization can be performed after the deposition, and a bonding surface 165 is thereby formed. In some embodiments, the bonding surface 165 is a planar surface. In some embodiments, the planarization includes an etching operation. The etching operation can include a dry etch (such as ion beam etch, plasma etch or reactive ion etch), a wet etch, or a combination thereof. In some embodiments, the planarization includes a polishing operation (e.g., a chemical-mechanical polishing (CMP) operation) followed by the etching operation. The planarization may include a time-mode CMP operation and/or a time-mode etching operation, and a thickness of the dielectric layer 123 over the conductive layer 14 can be controlled by a duration of the CMP operation or the etching operation. A thickness 53 of the dielectric layer 123 over the conductive layer 14 may be adjusted according to a designed electrical property of a device, and is not limited herein. In some embodiments, the thickness 53 is greater than 0.5 μm.

Figure 11:
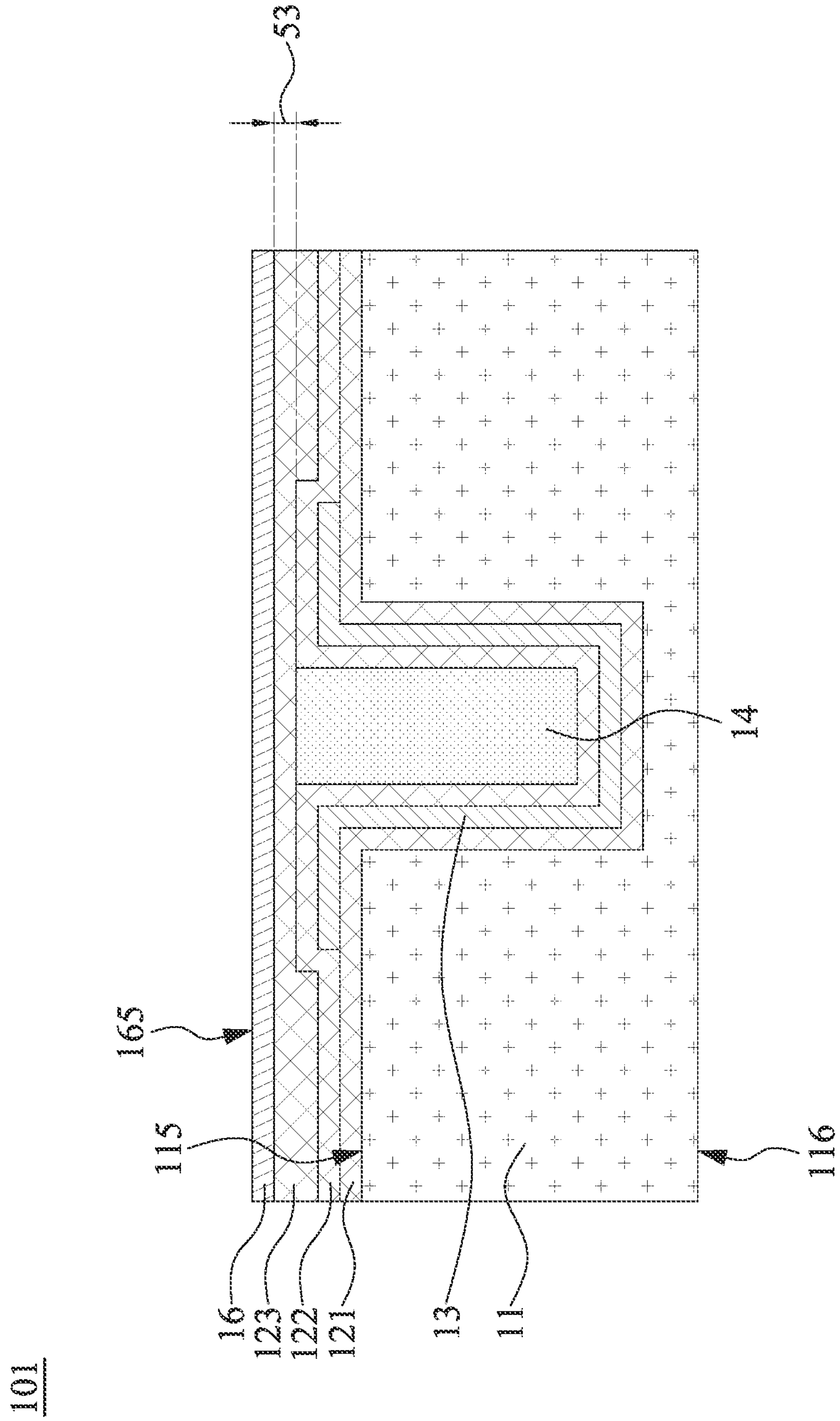

Referring to FIG. 11, a dielectric layer 16 is formed over the dielectric layer 123, and a structure 101 is thereby formed. The dielectric layer 16 may be for a purpose of a bonding operation performed in subsequent processing. In some embodiments, the dielectric layer 16 is formed over the dielectric layer 123 when the dielectric layer 123 is not suitable for a bonding operation. In some embodiments, the dielectric layer 16 is referred to as a bonding layer 16. In some embodiments, a top surface of the dielectric layer 16 is a planar surface and defines a bonding surface 165. In some embodiments, the dielectric layer 16 includes oxide. In some embodiments, the dielectric layer 16 may include a dielectric material different from that of the dielectric layer 123. In some embodiments, the dielectric layer 16 is formed by a deposition. In some embodiments, a thickness of the dielectric layer 16 is in a range of 0.1 to 2 μm.

Figure 12:
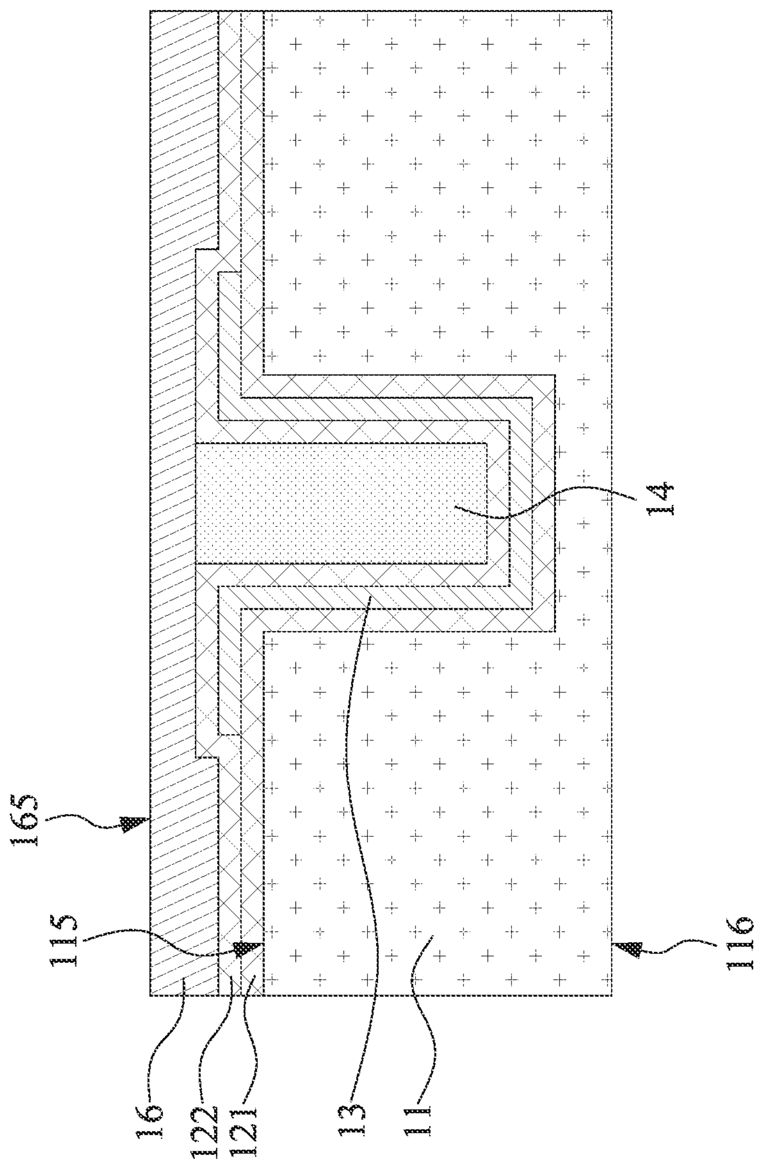

Referring to FIG. 12, the dielectric layer 123 of the intermediate structure shown in FIG. 10 is replaced by a dielectric layer 16, and a structure 102 is thereby formed. The formation of the dielectric layer 16 of the structure 102 is similar to the formation of the dielectric layer 123 of the structure 101, and repeated description is omitted herein. In some embodiments, when a material of the dielectric layer 123 is not suitable for the bonding operation, the dielectric layer 16 is formed and covers the dielectric layer 122 as shown in FIG. 12. In some embodiments, a top surface of the dielectric layer 16 defines a bonding interface 165. In some embodiments, the bonding surface 165 includes only the material of the dielectric layer 16. In some embodiments, a thickness of the dielectric layer 16 over the top surface of the conductive layer 14 is in a range of 0.1 to 2 μm. In some embodiments, the dielectric layer 16 covers an entirety of the dielectric layer 122 as shown in FIG. 12.

In other embodiments, when a material of the dielectric layer 122 is suitable for the bonding operation, the dielectric layer 16 may expose the dielectric layer 122.

Figure 13:
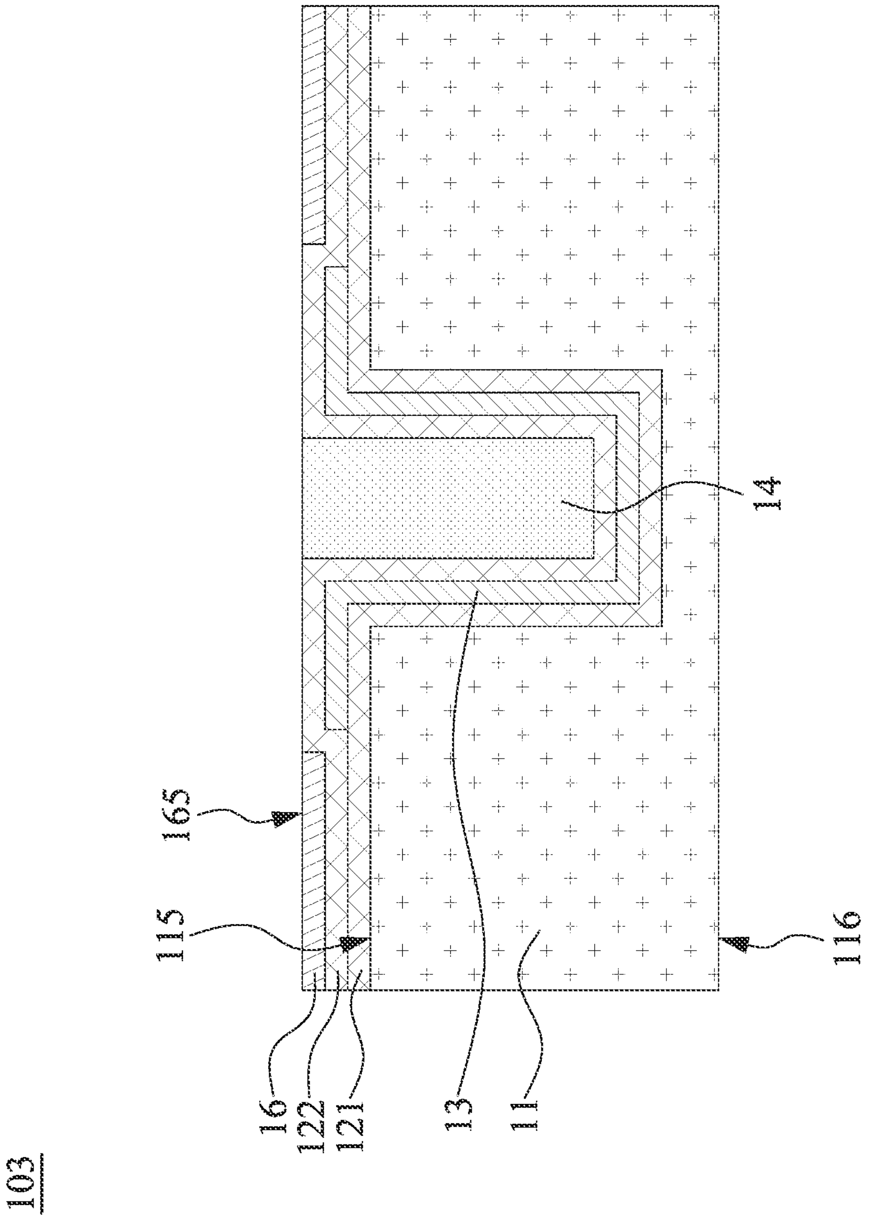

Referring to FIG. 13, a planarization of the dielectric layer 16 may stop at an exposure of the dielectric layer 122, and a structure 103 is thereby formed. In some embodiments, a top surface of the dielectric layer 16 is substantially aligned or coplanar with the top surface of the conductive layer 14 or a top surface of the dielectric layer 122. In some embodiments, the bonding surface 165 includes dielectric materials of the dielectric layers 122 and 16 and a conductive material of the conductive layer 14. In some embodiments, the bonding operation includes a hybrid-bonding operation.

Figure 14:
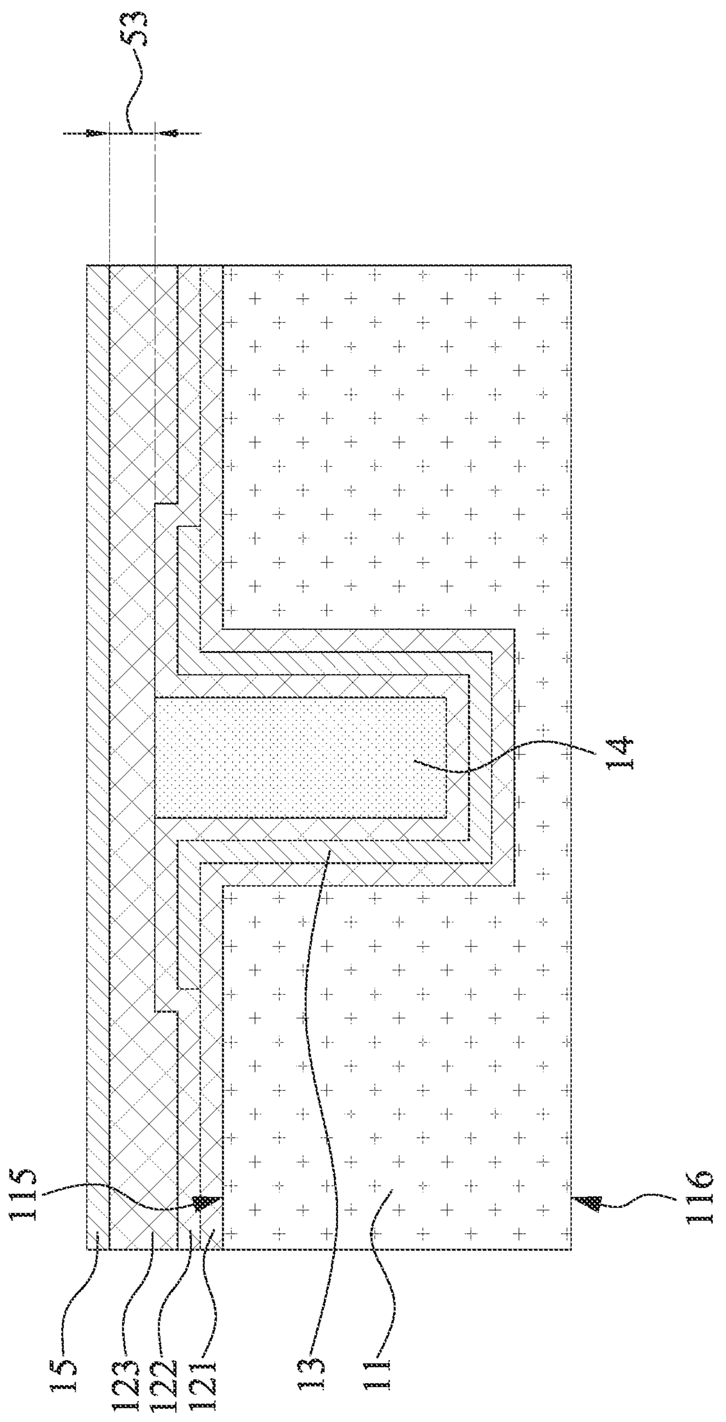

Referring to FIG. 14, a magnetic layer 15 is formed over the intermediate structure shown in FIG. 10. A material and formation of the magnetic layer 15 can be similar to or same as those of the magnetic layer 13, and repeated description is omitted herein. In some embodiments, a thickness of the magnetic layer 15 is in a range of 1 to 10 μm. The magnetic layer 15 is separated from the magnetic layer 13 by the dielectric layers 122 and 123, and the magnetic layer 15 is separated from the conductive layer 14 by the dielectric layer 123. In the embodiments with the presence of the magnetic layer 15, the thickness 53 of the dielectric layer 123 over the conductive layer 14 is less than 10 μm.

Figure 15:
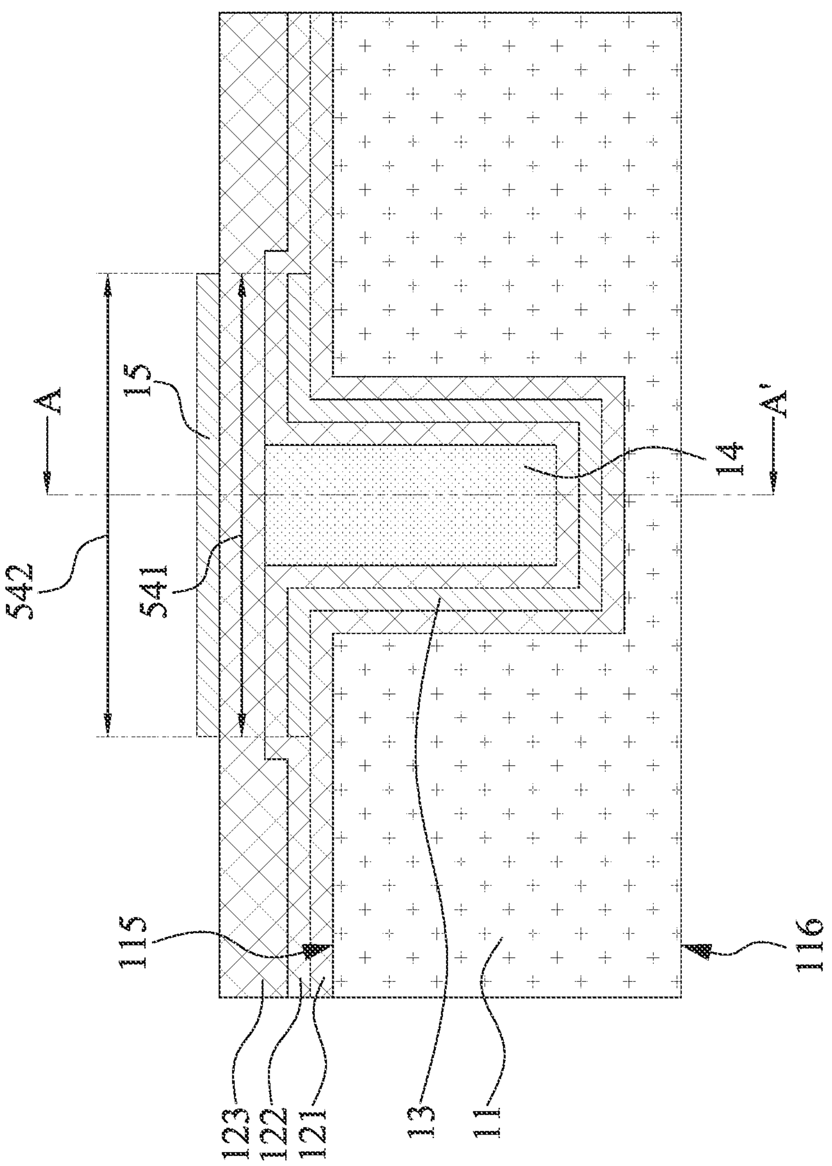
Figure 16:
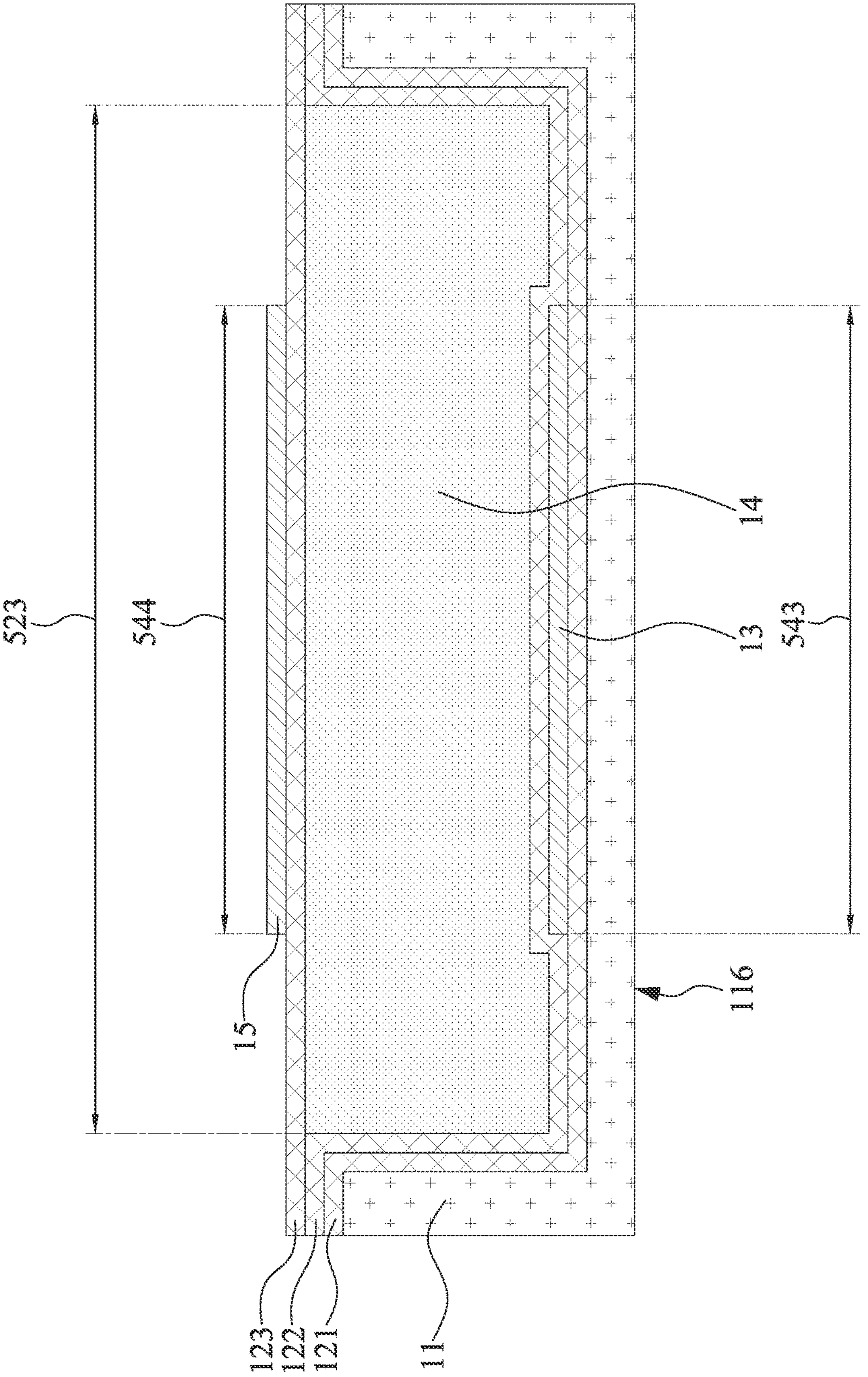
FIG. 16 is a schematic cross-sectional diagram along a line A-A' in FIG. 15 in accordance with some embodiments of the disclosure.

Referring to FIGS. 15 and 16, the magnetic layer 15 is patterned, wherein FIG. 16 is a schematic cross-sectional diagram of the intermediate structure of FIG. 15 along the line A-A' in FIG. 15. The magnetic layer 15 is over at least a portion of the conductive layer 14. In some embodiments, the magnetic layer 15 is over an entirety of the conductive layer 14 as shown in the cross section of FIG. 15. In some embodiments, a width 542 of the magnetic layer 15 is substantially equal to a width 541 of the magnetic layer 13 as shown in FIG. 15. In some embodiments, edges of the magnetic layer 15 are substantially aligned with edges of the magnetic layer 13 as shown in FIG. 15.

In some embodiments as shown in FIG. 16, a length 544 of the magnetic layer 15 is less than the length 523 of the conductive layer 14. In some embodiments, the magnetic layer 15 is over a central portion of the conductive layer 14 as shown in the cross section of FIG. 16. In some embodiments, the length 544 of the magnetic layer 15 is substantially equal to a length 543 of the magnetic layer 13 as shown in FIG. 16. In some embodiments, edges of the magnetic layer 15 are substantially aligned with edges of the magnetic layer 13 as shown in the cross section of FIG. 16.

Figure 17:
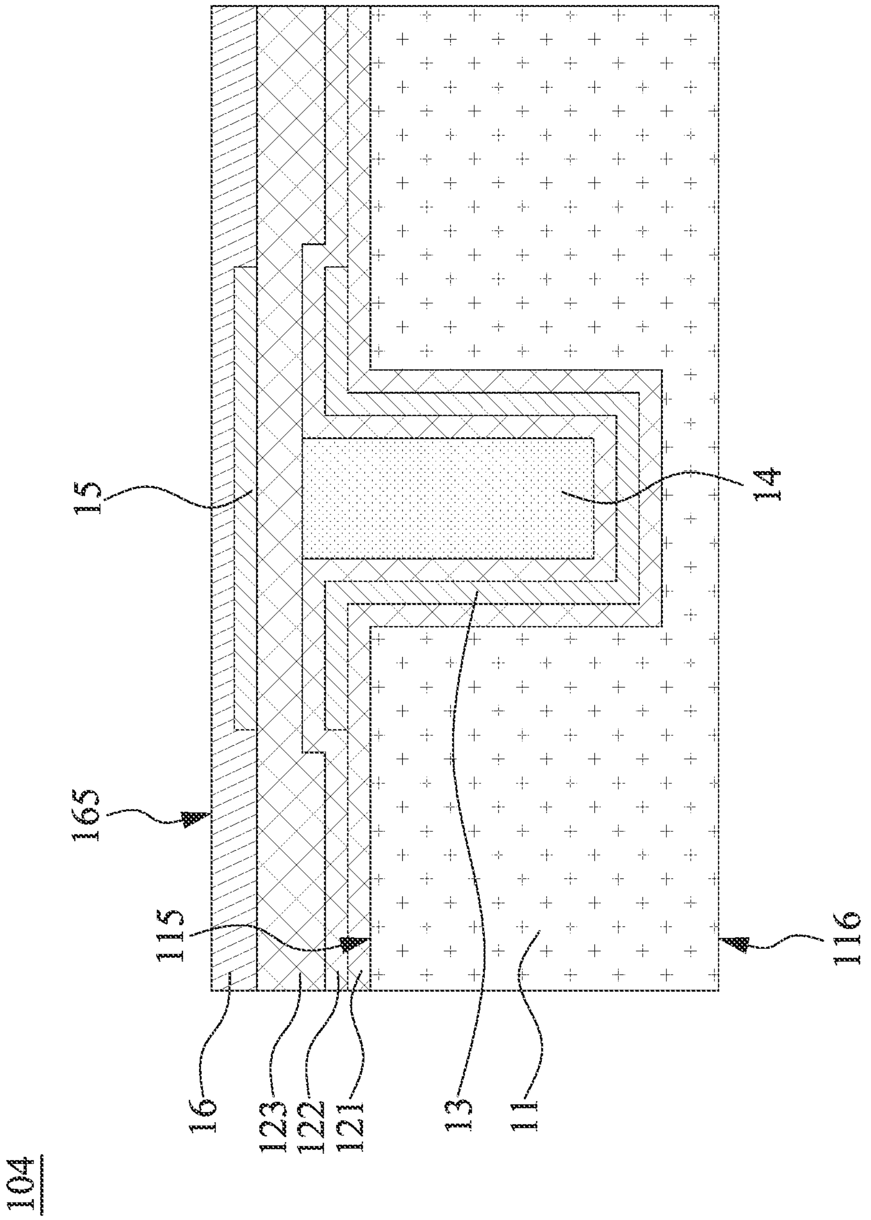
FIGS. 17 to 26 are schematic cross-sectional diagrams at different stages of a method of manufacturing semiconductor structures in accordance with some embodiments of the disclosure.

Referring to FIG. 17, a dielectric layer 16 is formed over the dielectric layer 123 and the magnetic layer 15, and a structure 104 is thereby formed. The dielectric layer 16 may be for a purpose of a bonding operation performed in subsequent processing. In some embodiments, the dielectric layer 16 is referred to as a bonding layer 16. Formation of the dielectric layer 16 of the structure 104 can be similar to formation of the dielectric layer 16 as illustrated above in other embodiments, and repeated description is omitted herein. A bonding surface 165 of the dielectric layer 16 can be above (or over) or substantially aligned with a top surface of the magnetic layer 15.

Figure 18:
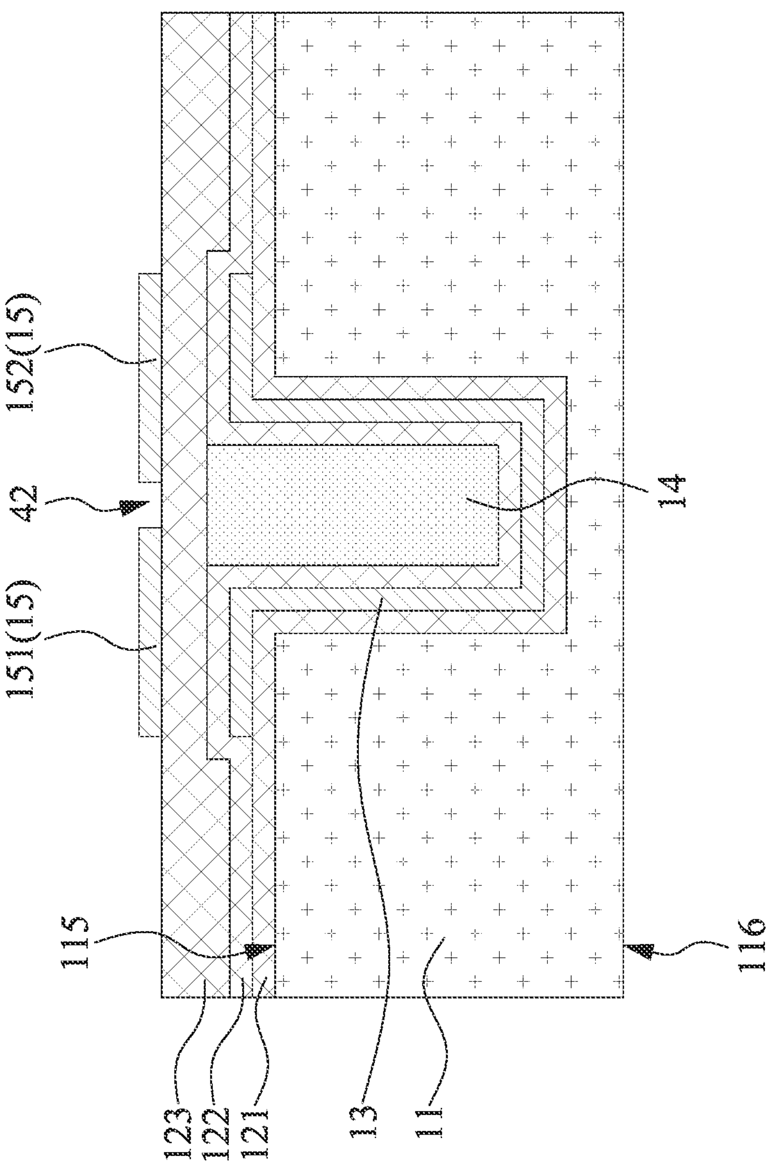

Referring to FIG. 18, an opening 42 is formed in the magnetic layer 15 in the patterning operation as depicted in FIG. 15 in accordance with some embodiments of the present disclosure. In some embodiments, the magnetic layer 15 includes a first portion 151 and a second portion 152 separated from the first portion 151 by the opening 42. A purpose of the opening 42 is to adjust a magnetic property of an inductor of a device, and a width of the opening (or a distance between the first portion 151 and the second portion 152) can be adjusted according to different applications. In some embodiments, the opening 42 is over a central portion of the conductive layer 14. In some embodiments, the conductive layer 14 is overlapped by an entirety of the opening 42 from a top view.

Figure 19:
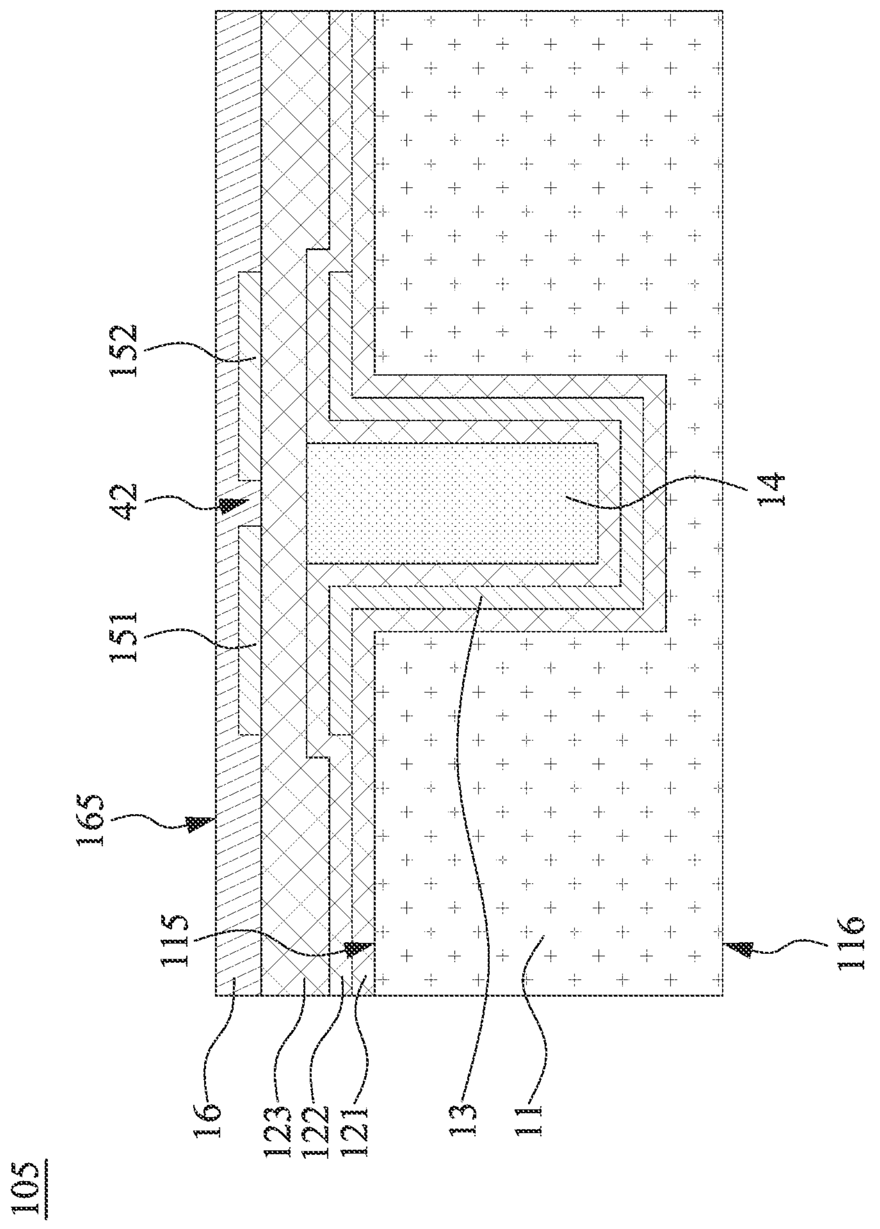

Referring to FIG. 19, a dielectric layer 16 is formed over the intermediate structure of FIG. 18, and a structure 105 is thereby formed. The dielectric layer 16 may be for a purpose of a bonding operation performed in subsequent processing. In some embodiments, the dielectric layer 16 is referred to as a bonding layer 16. Formation of the dielectric layer 16 of the structure 105 can be similar to that of the dielectric layer 16 as illustrated above, and repeated description is omitted herein. In some embodiments, the dielectric layer 16 covers an entirety of the first portion 151 and an entirety of the second portion 152 of the magnetic layer 15. In some embodiments, the dielectric layer 16 fills the opening 42. In some embodiments, a bonding surface 165 of the dielectric layer 16 is substantially aligned or coplanar with a top surface of the first portion 151 or the second portion 152 (not shown).

Figure 20:
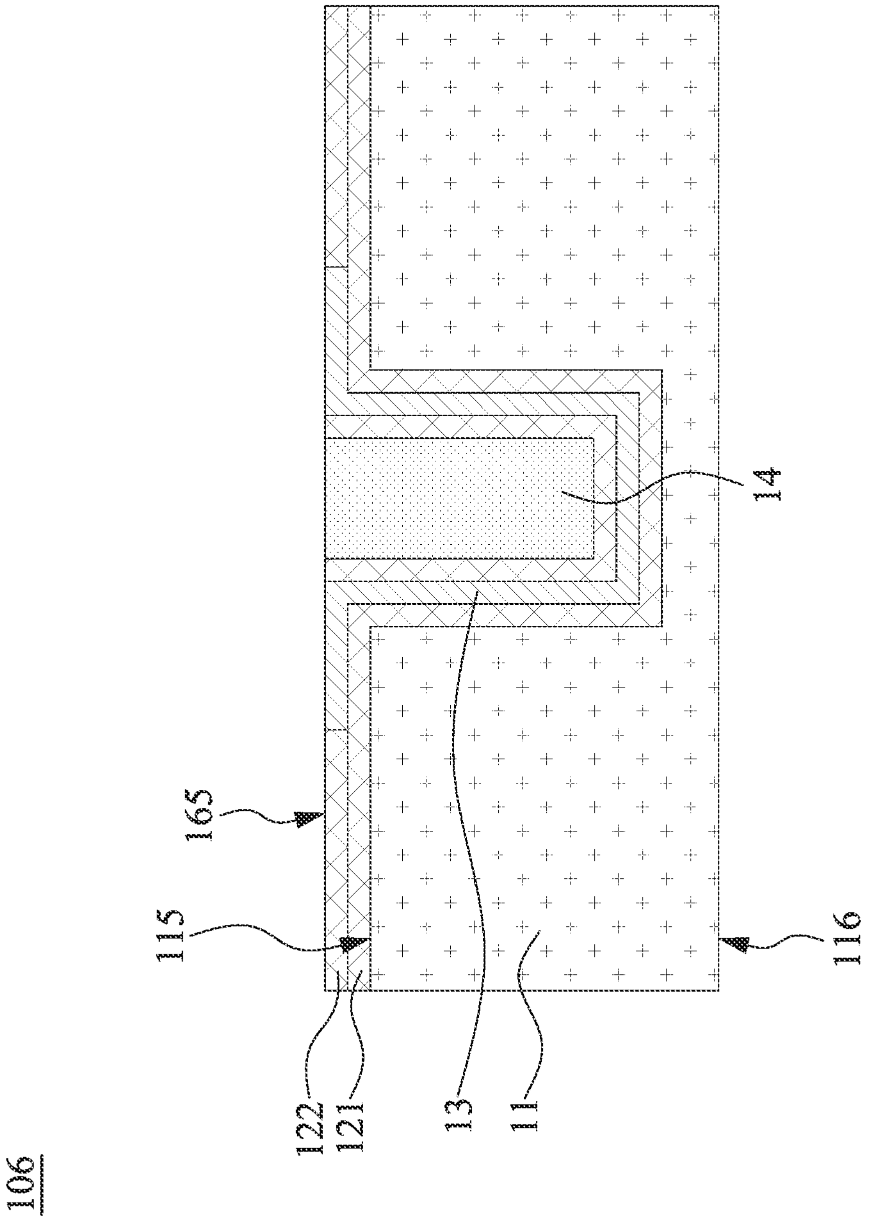

Referring to FIG. 20, a planarization is performed on the intermediate structure shown in FIG. 19, and a structure 106 is thereby formed in accordance with some embodiments of the present disclosure. In some embodiments, the planarization includes a patterning operation, and portions of the dielectric layer 122 above the magnetic layer 13 are removed. In some embodiments, the patterning operation includes an etching operation. The etching operation can include a dry etch (such as ion beam etch, plasma etch or reactive ion etch), a wet etch, or a combination thereof. In some embodiments, the planarization includes a polishing operation (e.g., a chemical-mechanical polishing operation, or CMP) and is optionally followed by an etching operation. The planarization may stop on an exposure of the dielectric layer 122. In some embodiments, the dielectric layer 122 includes a material suitable for a bonding operation, and the dielectric layer 122 can function as a bonding layer. In some embodiments, the dielectric layer 122 can be replaced by a dielectric layer 16 as illustrated above, wherein the dielectric layer 16 provides a bonding surface 165. Another dielectric layer 16 (similar to the dielectric layer 16 in FIG. 11) can be optionally formed if the dielectric layer 122 cannot be applied in the bonding operation.

Figure 21:
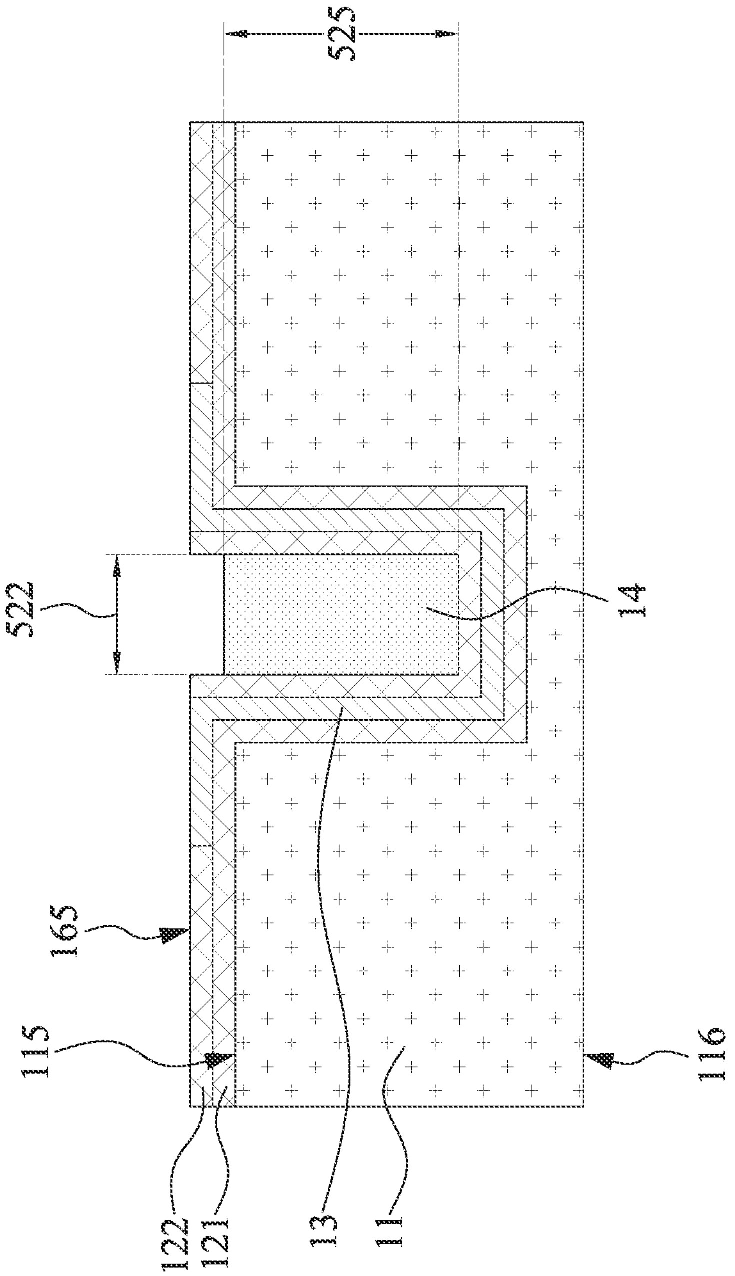

Referring to FIG. 21, the structure 106 is further processed in accordance with some embodiments of the present disclosure, and an etch-back operation is performed on the conductive layer 14. A depth of the conductive layer 14 is reduced from the depth 521 shown in FIG. 8 to a depth 525 shown in FIG. 21. In some embodiments, a difference between the depth 525 and the depth 521 is in a range of 1 to 10 μm. In some embodiments, a top surface of the conductive layer 14 is below a top surface of the dielectric layer 16 by a distance of 1 to 10 μm.

Figure 22:
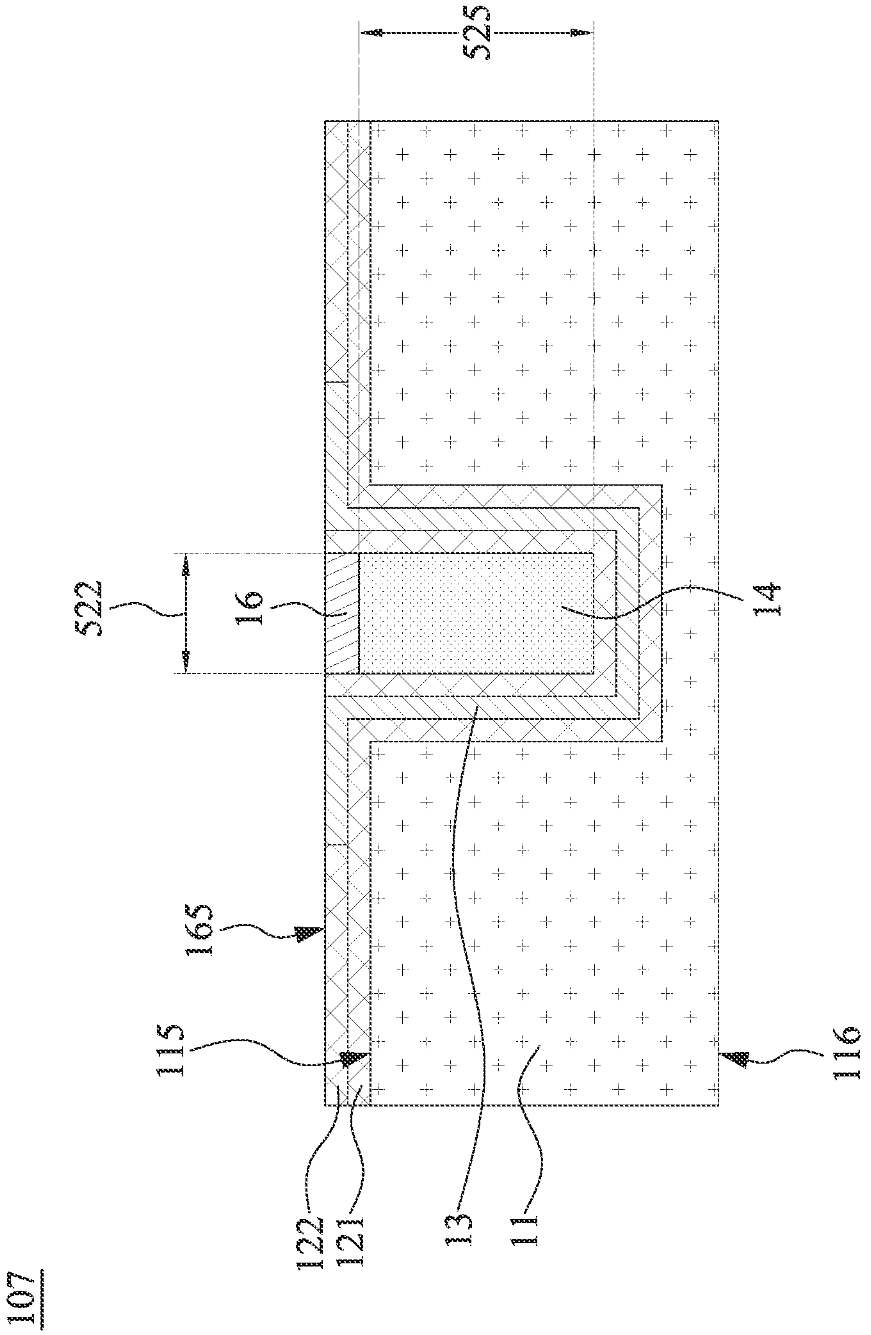

Referring to FIG. 22, a dielectric layer 16 is formed over the conductive layer 14 and fills the space defined by the dielectric layer 122 and the conductive layer 14. A structure 107 is thereby formed. In some embodiments, a thickness of the dielectric layer 16 is in a range of 1 to 10 μm. In some embodiments, a top surface of the dielectric layer 16 is substantially aligned or coplanar with a top surface of the magnetic layer 13 or the top surface of the dielectric layer 122.

Figure 23:
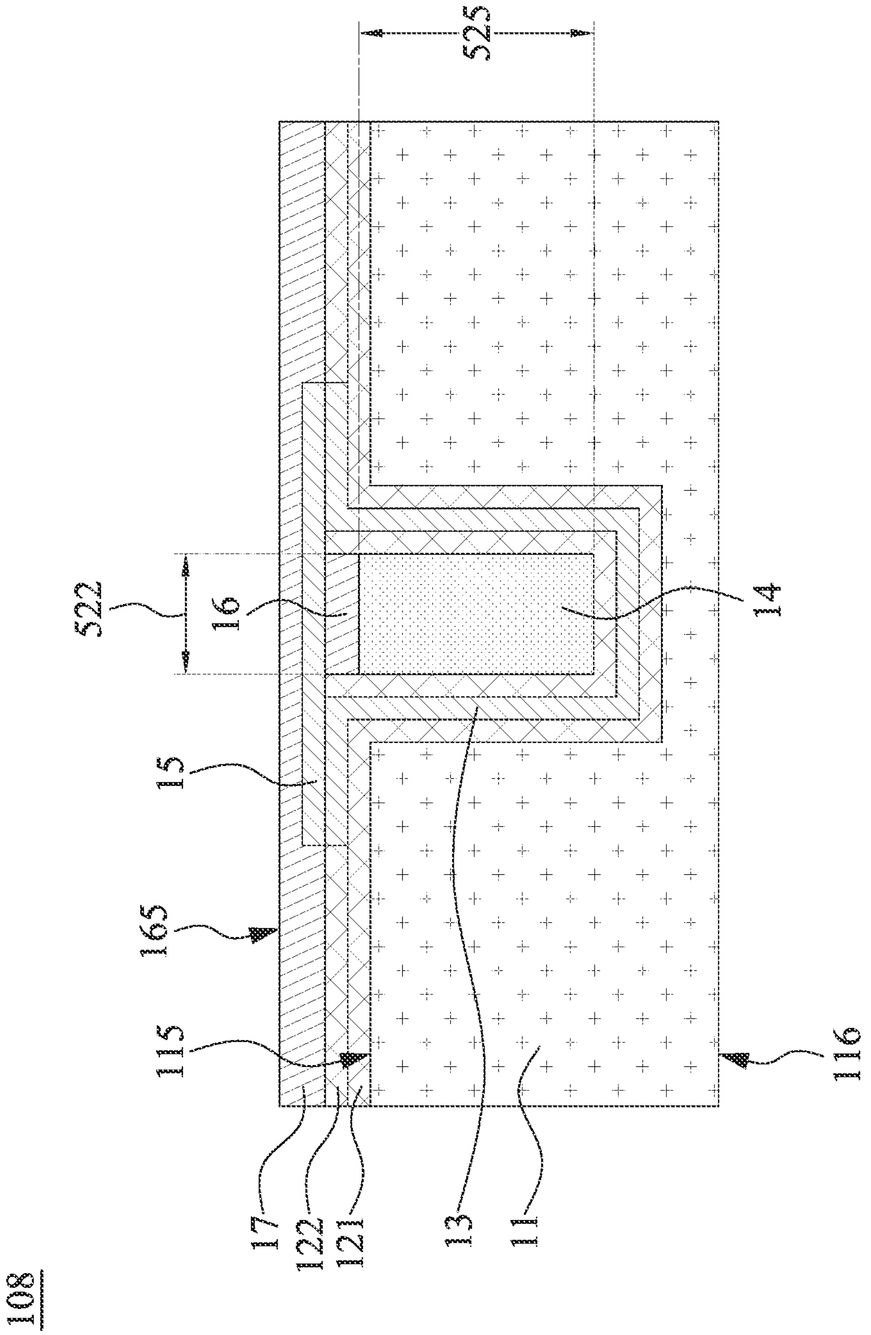

Referring to FIG. 23, the structure 107 is further processed in accordance with some embodiments of the present disclosure, and a magnetic layer 15 and a dielectric layer 17 are formed over the top surfaces of the magnetic layer 13 and the dielectric layer 122. The dielectric layer 17 can be similar to the dielectric layer 16 as described above, and the operations depicted in FIGS. 14 to 17 are performed on the structure 107 to form a structure 108 as shown in FIG. 23. In some embodiments, the magnetic layer 15 contacts the magnetic layer 13. In some embodiments, sidewalls of the magnetic layer 15 are aligned with sidewalls of the magnetic layer 13. The magnetic layer 15 is separated from the conductive layer 14 by the dielectric layer 16, and therefore a distance between the magnetic layer 15 and the conductive layer 14 is substantially equal to the thickness of the dielectric layer 16. In these embodiments, the dielectric layer 16 can be replaced by a dielectric layer 123 since the dielectric layer 16 does not function as a bonding layer.

Figure 24:
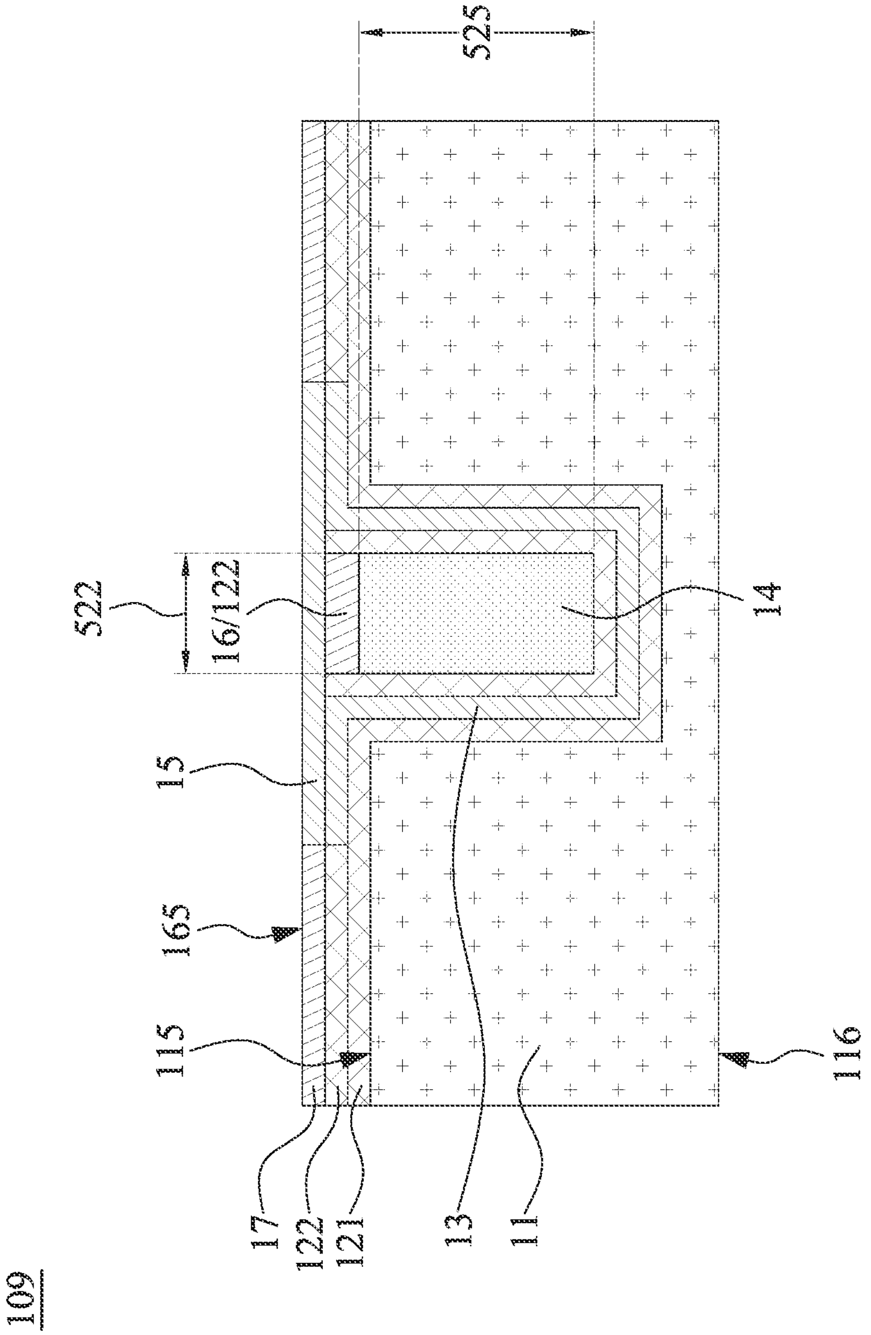

Referring to FIG. 24, the dielectric layer 17 is etched and the magnetic layer 15 is exposed. A structure 109 is thereby formed. In some embodiments, a top surface of the dielectric layer 17 is substantially aligned with the top surface of the magnetic layer 15. In some embodiments, a bonding surface 165 includes dielectric materials of the dielectric layers 16 and 17 and a magnetic material of the magnetic layer 15.

Figure 25:
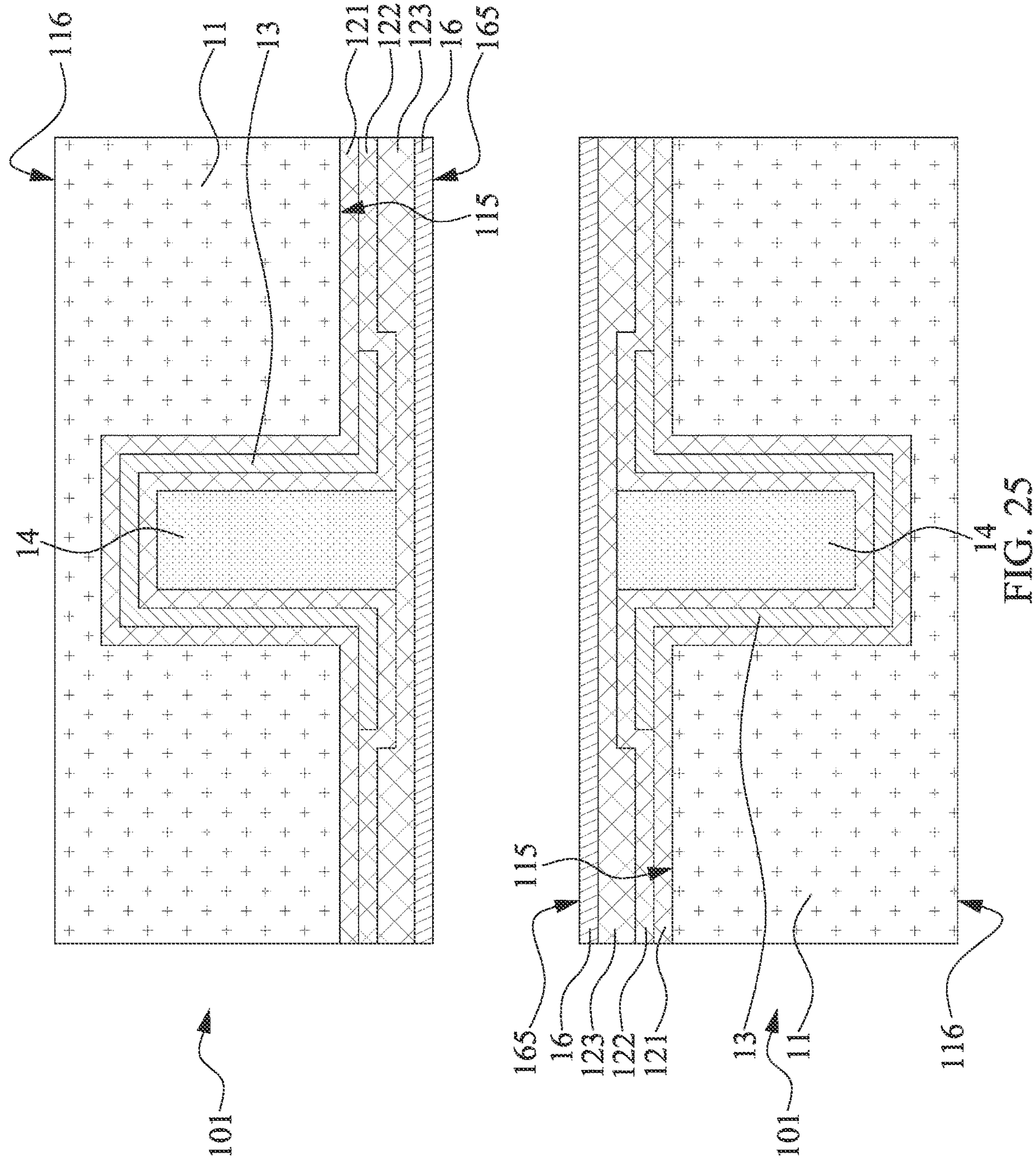

Referring to FIG. 25, two structures similar to the structures 101 to 109 are faced toward one another. In some embodiments as shown in FIG. 25, a structure 101 is flipped over and disposed over another structure 101, and bonding surfaces 165 of the two structures 101 are faced toward each other. In some embodiments, an upper structure 101 is moved toward a lower structure 101.

Figure 26:
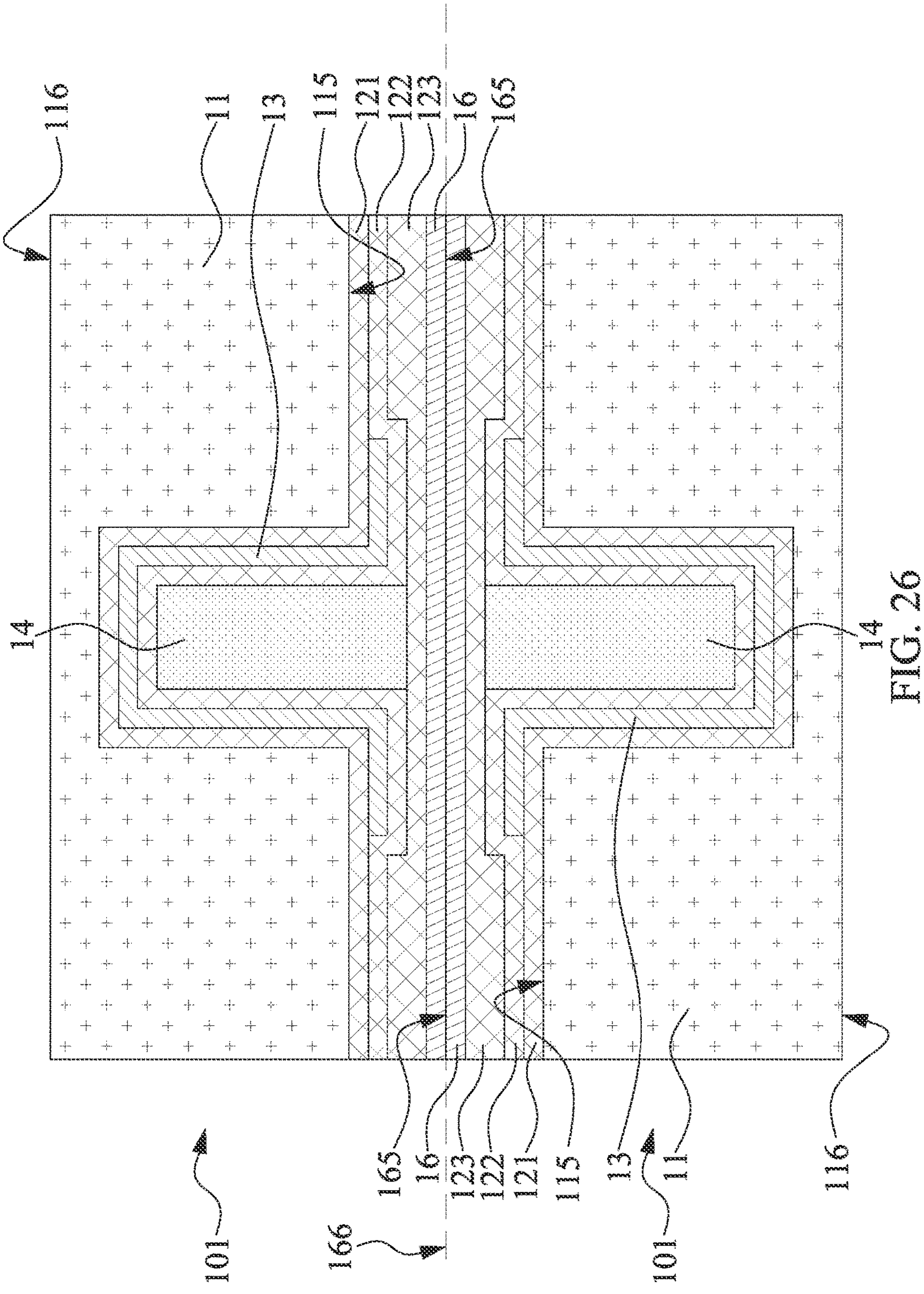

Referring to FIG. 26, a bonding operation is performed, and the upper and lower structures 101 are bonded to form an inductor structure 201. It should be noted that any two structures similar to the structures 101 to 109 can be bonded to form an inductor structure as long as conductive layers are separated from each other and from magnetic layers so as to ensure proper functioning of the inductor structure. A distance between the conductive layers 14 of the lower and upper structures 101 can be adjusted to achieve a desired electrical property (e.g., an inductance or a coupling factor) of the inductor structure 201. A bonding interface 166 is defined by the two structures 101. In some embodiments, the distance between the conductive layers 14 is in a range of 1 to 10 μm.

In following paragraphs, different embodiments of inductor structures are provided for a purpose of illustration.

However, the present disclosure is not limited thereto. For a purpose of clarity, reference numbers of elements with same or similar functions are repeated in different embodiments. However, such usage is not intended to limit the present disclosure to specific embodiments or specific elements. In addition, for a purpose of simplicity, only differences between the embodiments are illustrated in the following description, and similar or same functions, properties, positions and formations of elements are omitted.

Figure 27:
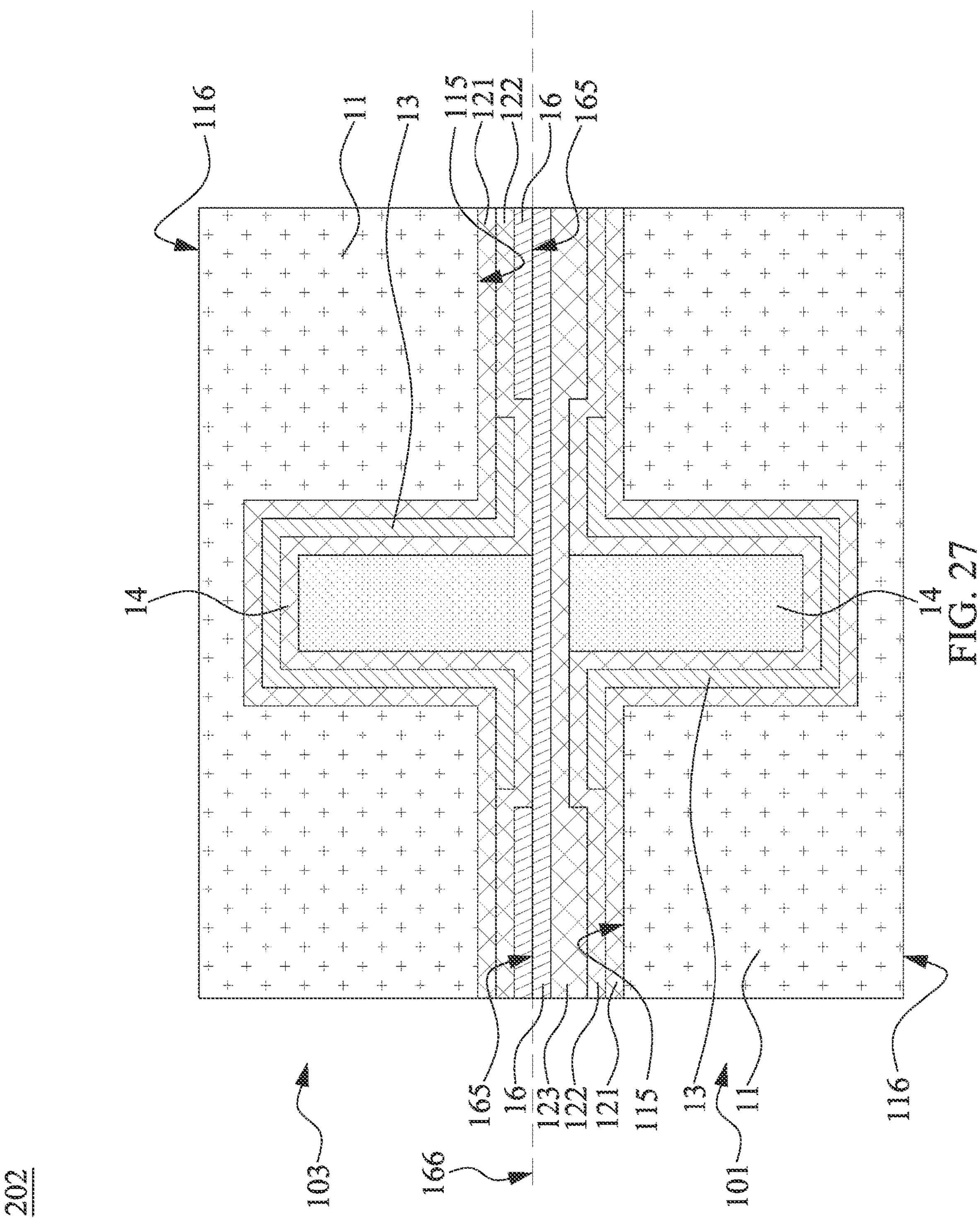
FIGS. 27 to 32 are schematic cross-sectional diagrams of inductor structures in accordance with different embodiments of the disclosure.

Referring to FIG. 27, a structure 103 is bonded to a structure 101, and an inductor structure 202 is thereby formed. In some embodiments, a distance between conductive layers 14 of the inductor structure 202 is less than the distance between the conductive layers 14 of the inductor structure 201. In some embodiments, an inductance of the inductor structure 202 substantially greater than the inductance of the inductor structure 201. In some embodiments, a coupling factor of the inductor structure 202 is substantially greater than the coupling factor of the inductor structure 201.

Figure 28:
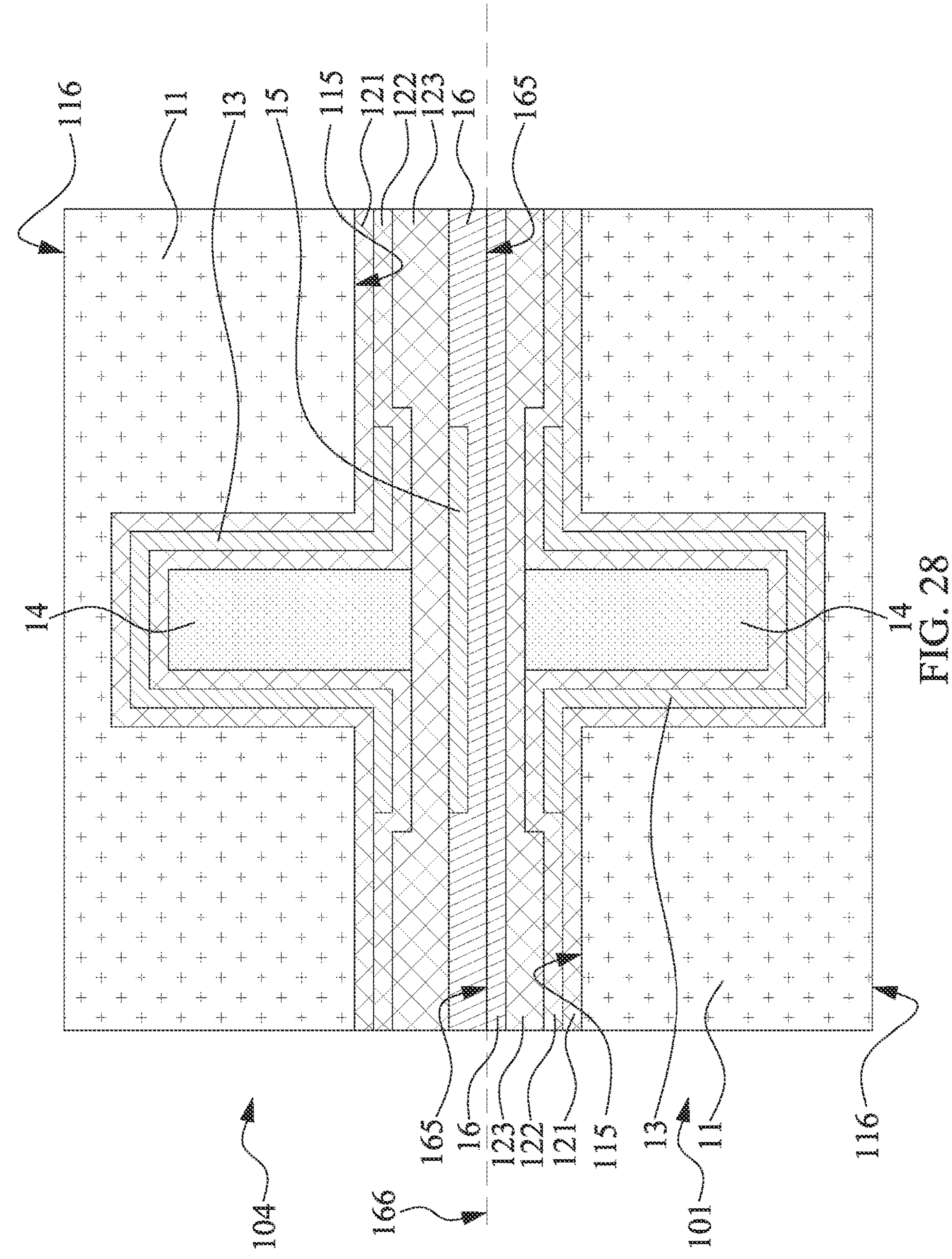

Referring to FIG. 28, a structure 104 is bonded to a structure 101, and an inductor structure 203 is thereby formed. In some embodiments, a distance between conductive layers 14 of the inductor structure 203 is greater than the distance between the conductive layers 14 of the inductor structure 202. In some embodiments, the distance between the conductive layers 14 of the inductor structure 203 is substantially equal to or greater than the distance between the conductive layers 14 of the inductor structure 201. In some embodiments, an inductance of the inductor structure 203 is substantially greater than the inductance of the inductor structure 201 or 202. In some embodiments, a coupling factor of the inductor structure 203 is substantially less than the coupling factor of the inductor structure 201 or 202.

Figure 29:
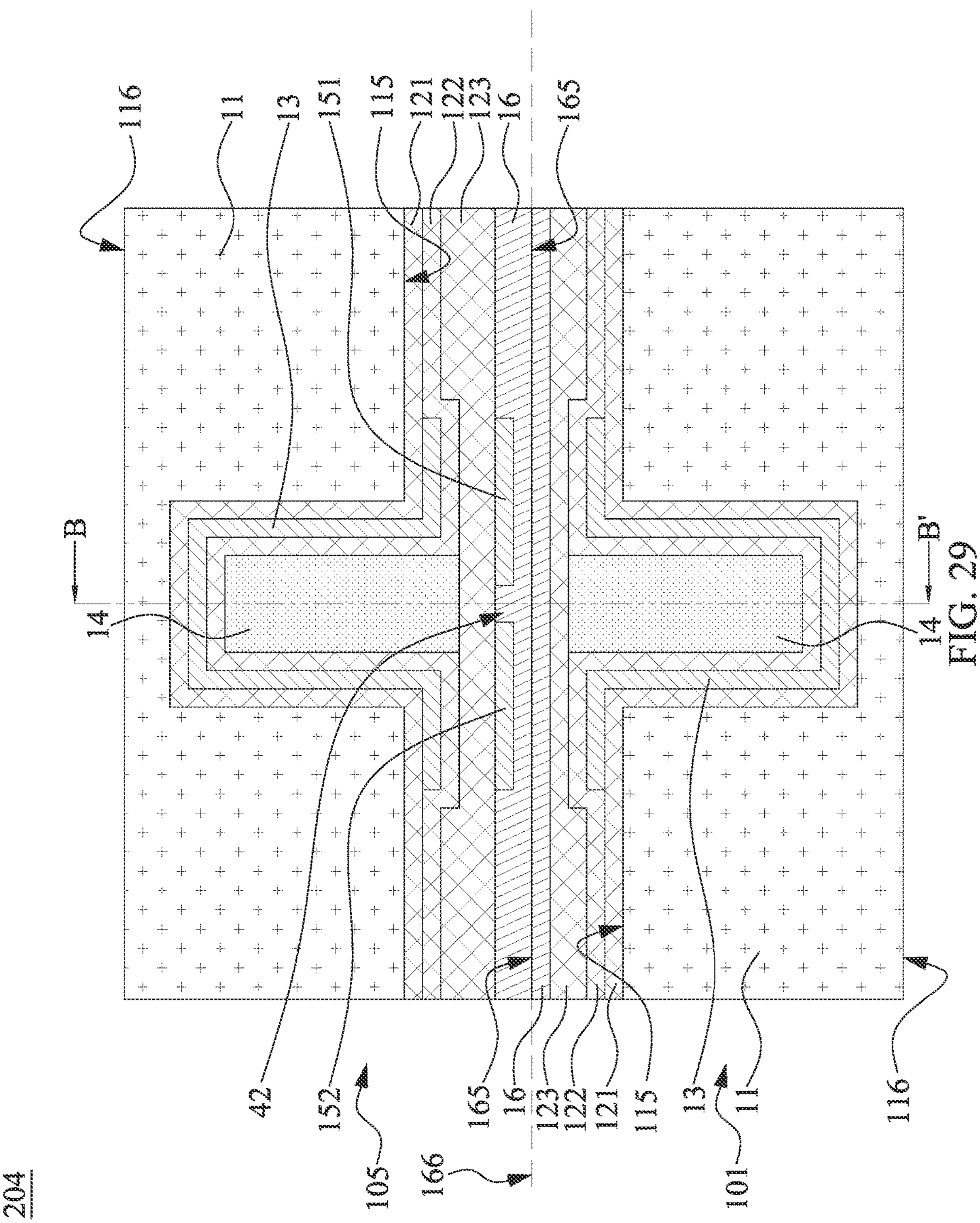

Referring to FIG. 29, a structure 105 is bonded to a structure 101, and an inductor structure 204 is thereby formed. In some embodiments, a distance between conductive layers 14 of the inductor structure 204 is substantially equal to the distance between the conductive layers 14 of the inductor structure 203. In some embodiments, a thickness of a magnetic layer 15 of the inductor structure 204 is substantially equal to a thickness of a magnetic layer 15 of the inductor structure 203. In some embodiments, an inductance of the inductor structure 204 is substantially less than the inductance of the inductor structure 203. In some embodiments, a coupling factor of the inductor structure 204 is greater than the coupling factor of the inductor structure 203.

Figure 30:
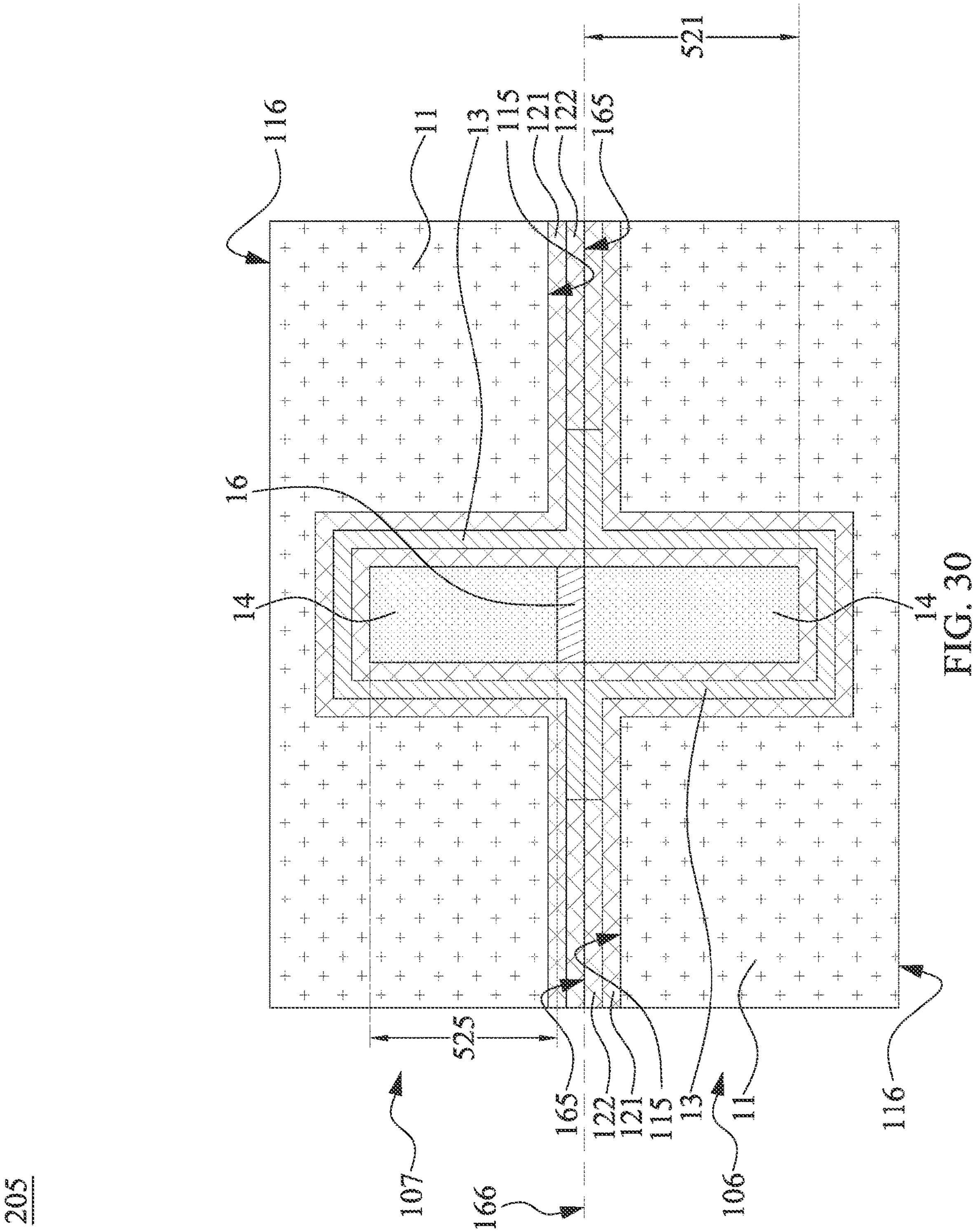

Referring to FIG. 30, a structure 107 is bonded to a structure 106, and an inductor structure 205 is thereby formed. In some embodiments, magnetic layers 13 of the structures 106 and 107 are in contact at a bonding interface 166 of the inductor structure 205. In some embodiments, a depth 521 of a conductive layer 14 of the structure 106 is different from a depth 525 of a conductive layer 14 of the structure 107. In some embodiments, the depth 525 is substantially less than the depth 521. In some embodiments, a distance between the conductive layers 14 is defined by a thickness of a dielectric layer 16.

Figure 31:
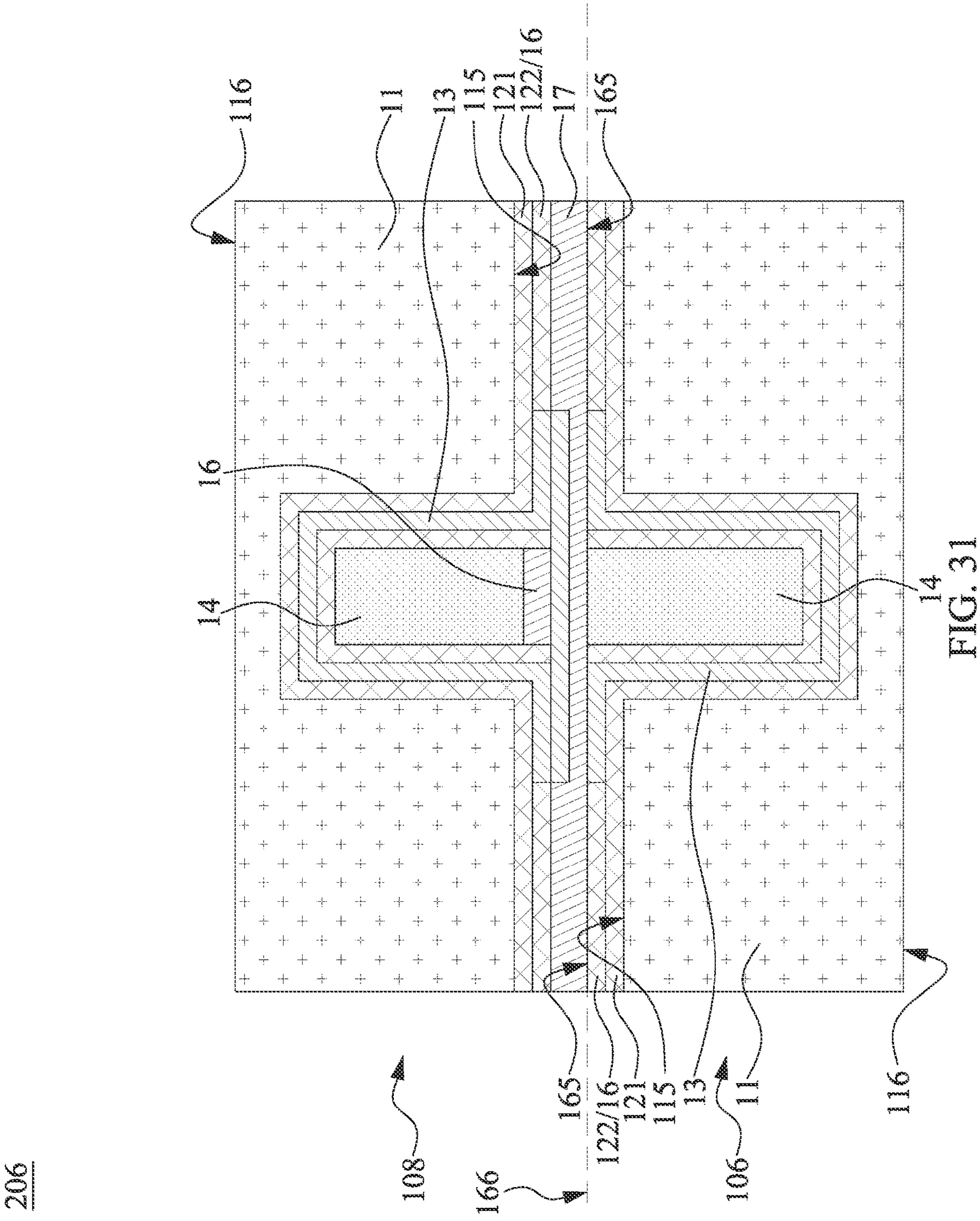

Referring to FIG. 31, a structure 108 is bonded to a structure 106, and an inductor structure 206 is thereby formed. A magnetic layer 15 of the structure 108 contacts a magnetic layer 13 of the structure 108 and is separated from a magnetic layer 13 of the structure 106 by a dielectric layer 16 at a bonding interface 166. In some embodiments, the depth 521 of the conductive layer 14 of the structure 106 is different from a depth 525 of a conductive layer 14 of the structure 108. In some embodiments, the depth 525 is substantially less than the depth 521.

Figure 32:
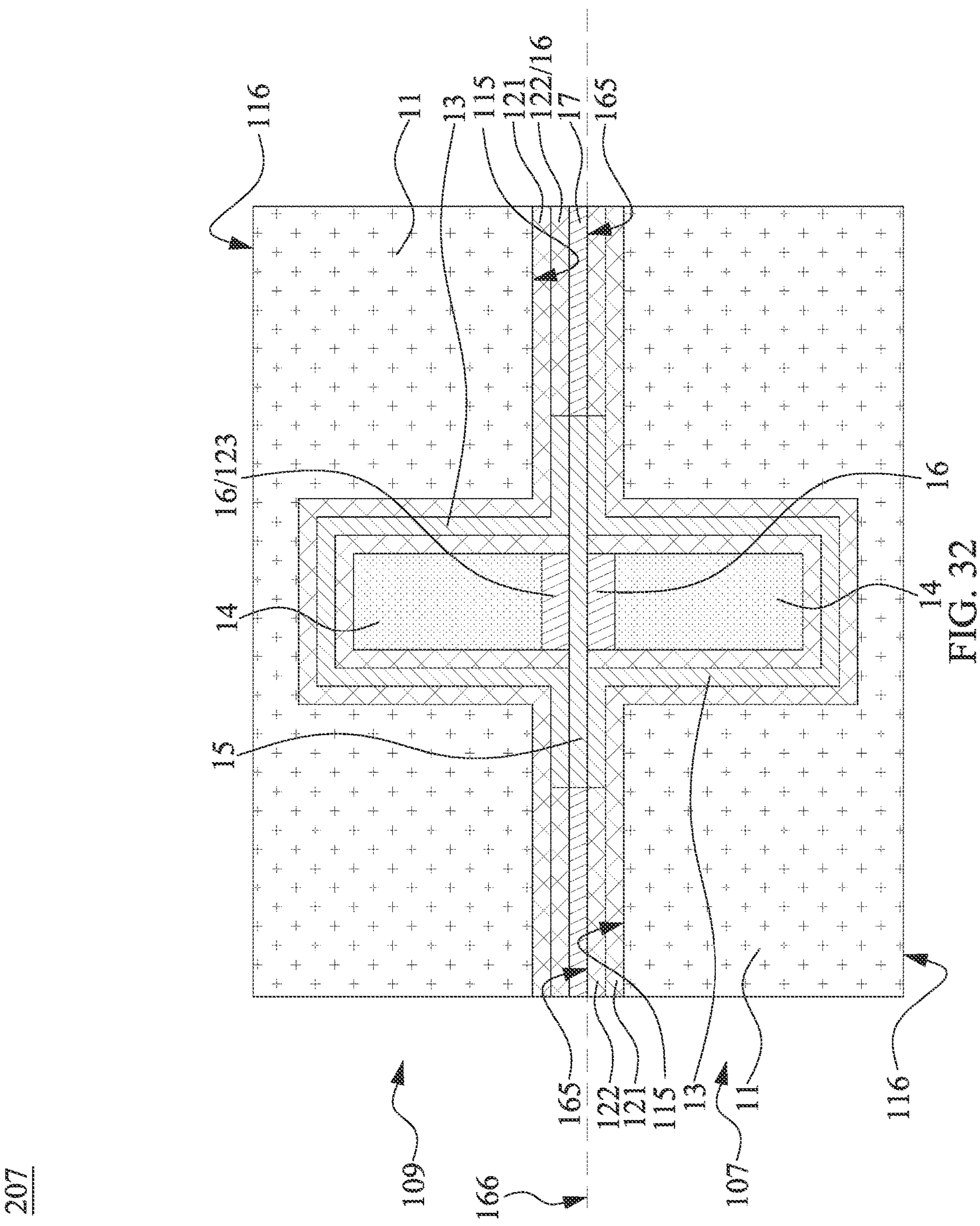

Referring to FIG. 32, a structure 109 is bonded to a structure 107, and an inductor structure 207 is thereby formed. In some embodiments, depths of magnetic layers 13 of the structures 109 and 107 are substantially identical. In some embodiments, the magnetic layer 13 of the structure 109 contacts a magnetic layer 15 of the structure 109, and the magnetic layer 15 of the structure 109 contacts a magnetic layer 13 of the structure 107 at a bonding interface 166 of the inductor structure 207. In some embodiments, depths (or heights) of conductive layers 14 of the structures 107 and 109 are substantially equal.

Figure 33:
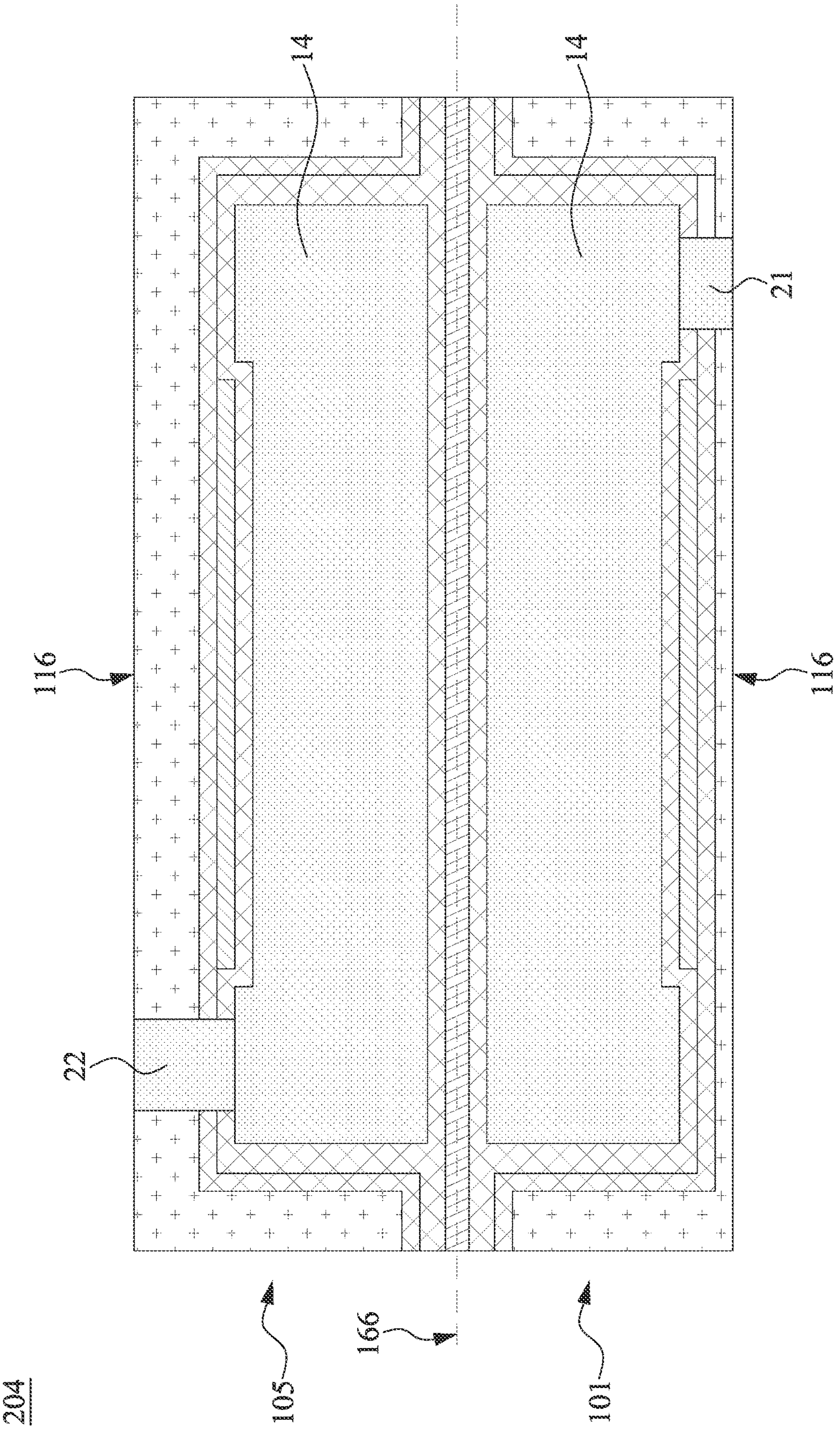
FIG. 33 is a schematic cross-sectional diagram along a line B-B' in FIG. 29 in accordance with some embodiments of the disclosure.

Referring to FIG. 33, a schematic cross-sectional diagram of the inductor structure 204 along a line B-B' in FIG. 29 is provided. The structure 101 may further include a conductive plug 21 electrically connected to the conductive layer 14 of the structure 101, and the structure 105 may further include a conductive plug 22 electrically connected to the conductive layer 14 of the structure 105. The conductive plugs 21 and 22 are for a purpose of providing electrical connection to the conductive layers 14 respectively. In some embodiments, the conductive plug 21 or 22 is formed from a second surface 116 of the structure 101 or 105. In some embodiments, the conductive plug 21 or 22 is formed after formation of the dielectric layer 16 shown in FIG. 11 or 19. In some embodiments, the structure 101 or 105 shown in FIG. 11 or 19 is flipped over prior to the formation of the conductive plug 21 or 22 and after the formation of the dielectric layer 16 shown in FIG. 11 or 19. In some embodiments, a substrate 11 of the structure 101 or 105 is thinned down prior to the formation of the conductive plug 21 or 22.

Figure 34:
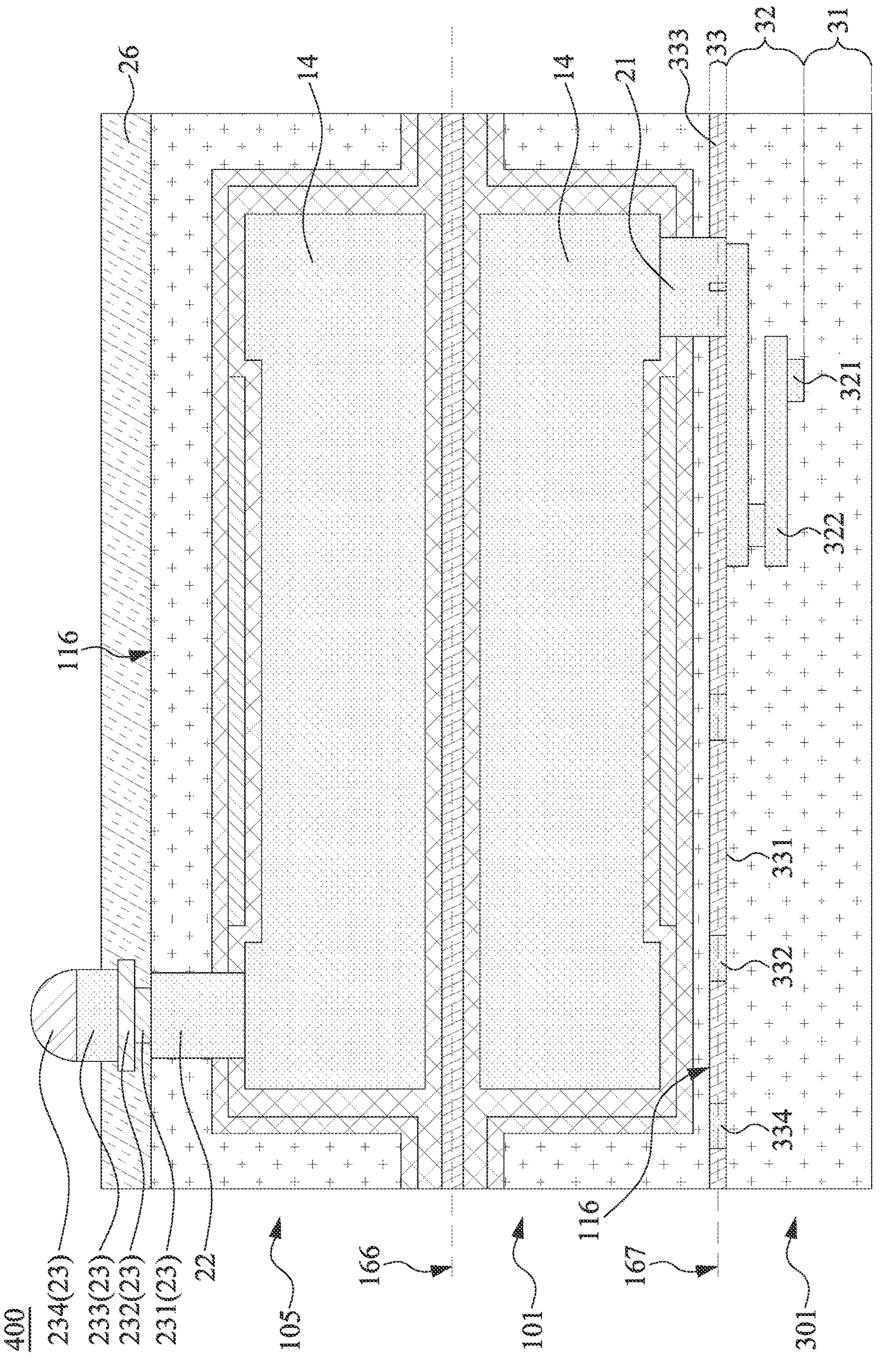
FIG. 34 is a schematic cross-sectional diagram of a semiconductor structure in accordance with some embodiments of the disclosure.

Referring to FIG. 34, a schematic cross-sectional diagram of a semiconductor structure 400 is provided in accordance with some embodiments of the present disclosure. In some embodiments, the inductor structure 204 shown in FIG. 33 is applied in the semiconductor structure 400. A semiconductor substrate 301 may be bonded to the inductor structure 204 on a side of the structure 101 opposite to the structure 105. The semiconductor substrate 301 may include an interconnection structure 32 disposed or formed over a substrate 31. In some embodiments, the substrate 31 includes a semiconductive material layer, a plurality of electrical components formed there over, and an insulating layer covering the electrical components thereon. The plurality of electrical components may be formed on the semiconductive material layer following conventional methods of manufacturing semiconductors. The electrical components can be active components or devices, and may include different types or generations of devices. The electrical components can include a planar transistor, a multi-gate transistor, a gate-all-around field-effect transistor (GAAFET), a fin field-effect transistor (FinFET), a vertical transistor, a nanosheet transistor, a nanowire transistor, a passive device, a capacitor, a plurality thereof, or a combination thereof. The interconnection structure 32 may include multiple conductive vias 321 alternately arranged between multiple conductive lines 322. The interconnection structure 32 may further include an intermetal dielectric (IMD) structure surrounding the conductive vias 321 and the conductive lines 322.

The structure 101 and the semiconductor substrate 301 may be bonded through a bonding region 33 disposed therebetween. In some embodiments, the bonding region 33 includes a dielectric layer 331 formed over the interconnection structure 32 of the semiconductor substrate 301 and a plurality of conductive patterns 332 surrounded by the dielectric layer 331. In some embodiments, the bonding region 33 includes a dielectric layer 333 formed over the second surface 116 of the structure 101 and a plurality of conductive patterns 334 surrounded by the dielectric layer 333. In some embodiments, a hybrid bonding operation is performed to bond the structure 101 to the semiconductor substrate 301. The conductive layer 14 of the structure 101 can electrically connect to the electrical components in the substrate layer 31 of the semiconductor substrate 301 through the conductive plug 21, the conductive patterns 334 and 332 in the bonding region 33 and the interconnection structure 32. A bonding interface 167 is defined between the dielectric layers 331 and 333. In some embodiments, the conductive patterns 334 are aligned with the conductive patterns 332.

The semiconductor structure 400 may further include a passivation layer 26 formed over the structure 105 on a side opposite to the structure 101. The passivation layer 26 can be a single-layer or a multilayer structure, and is not limited herein. The conductive layer 14 of the structure 105 may be electrically connected to another device, chip, or die through a connector 23. In some embodiments, the connector 23 includes a via portion 231 connected to the conductive plug 22, a pad portion (e.g., an aluminum pad) 232 over the via portion 231, a plug portion 233 over the pad portion 232, and a bump portion 234 (e.g., a solder bump) over the plug portion 233. In some embodiments, the via portion 231 and the pad portion 232 are surrounded by the passivation layer 26. In some embodiments, at least a portion of the plug portion 233 is exposed from or above the passivation layer 26.

Figure 35:
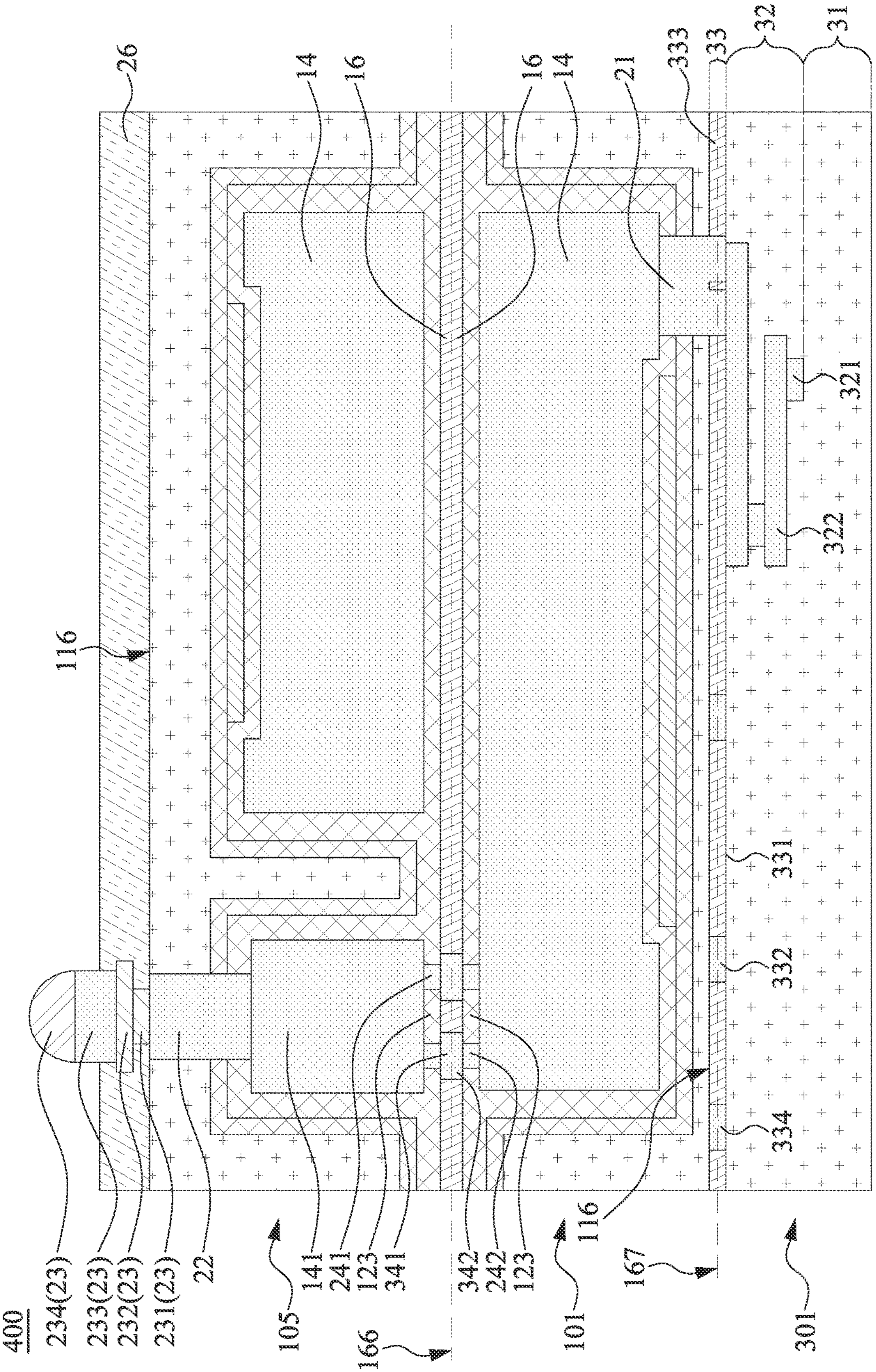
FIG. 35 is a schematic cross-sectional diagram of a semiconductor structure in accordance with some embodiments of the disclosure.

Referring to FIG. 35, a schematic cross-sectional diagram of a semiconductor structure 401 is provided in accordance with some embodiments of the present disclosure. The semiconductor structure 401 can be similar to the semiconductor structure 400 but the structure 105 further includes a conductive layer 141 horizontally adjacent to the conductive layer 14 and electrically connected to the conductive layer 14 of the structure 101. FIG. 34 shows an embodiment that the conductive layer 14 of the structure 105 electrically connects to a power source or another electrical component thorough the conductive plug 22 and the connector 23 at a side of the structure 105 opposite to the structure 101 (i.e., a front side of the semiconductor structure 401). The conductive layer 14 of the structure 101 can electrically connect to the power source or other electrical components through the conductive plug 22 and the connector 23 by the presence of the conductive layer 141.

In some embodiments, the conductive layer 141 is formed concurrently with the conductive layer 14 in the operation shown in FIGS. 8 and 9. In some embodiments, the conductive layer 141 is electrically isolated from the conductive layer 14 of the structure 105. In some embodiments, the conductive layer 141 is physically separated from the conductive layer 14 of the structure 105. In some embodiments, the conductive layer 141 is for a purpose of electrical connection to the conductive layer 14 of the structure 101 disposed below the structure 105. In some embodiments, the structure 105 includes a plurality of conductive vias 341 penetrating the dielectric layer 123 of the structure 105 and electrically connecting the conductive layer 141. In some embodiments, the conductive vias 341 are formed prior to or after the operations depicted in FIG. 18. In some embodiments, the structure 101 includes a plurality of conductive vias 342 penetrating the dielectric layer 123 of the structure 101. In some embodiments, the conductive vias 341 are formed prior to or after the operations depicted in FIG. 10.

The structure 101 and the structure 105 may be bonded through a bonding region 34 disposed therebetween, wherein the bonding region 33 includes the dielectric layers 16 of the structures 101 and 105. In some embodiments, the bonding region 34 includes a plurality of conductive patterns 341 surrounded by the dielectric layer 16 of the structure 105 and a plurality of conductive patterns 342 surrounded by the dielectric layer 16 of the structure 101. The conductive patterns 341 are aligned to and electrically connect to the conductive patterns 342. In some embodiments, the conductive layer 14 of the structure 101 is electrically connected to the conductive layer 141 through the conductive vias 241 and 242 and the conductive patterns 341 and 342. In some embodiments, a hybrid bonding operation is performed to bond the structure 101 and the structure 105. The conductive layer 14 of the structure 101 can thereby electrically connect to other electrical components or the power source through the connector 23. It should be noted that FIG. 35 provides an exemplary embodiment showing how electrical connection to the conductive layer 14 of the structure 101 from the front side of the semiconductor structure 401. In some embodiments, the conductive layer 14 electrically connects to the power source or other electrical components through another connector (not shown) from the front side of the semiconductor structure 401 (similar to that shown in FIG. 34).

To summarize the operations as illustrated in FIGS. 1 to 32 above, a method 600 within a same concept of the present disclosure is provided.

Figure 36:
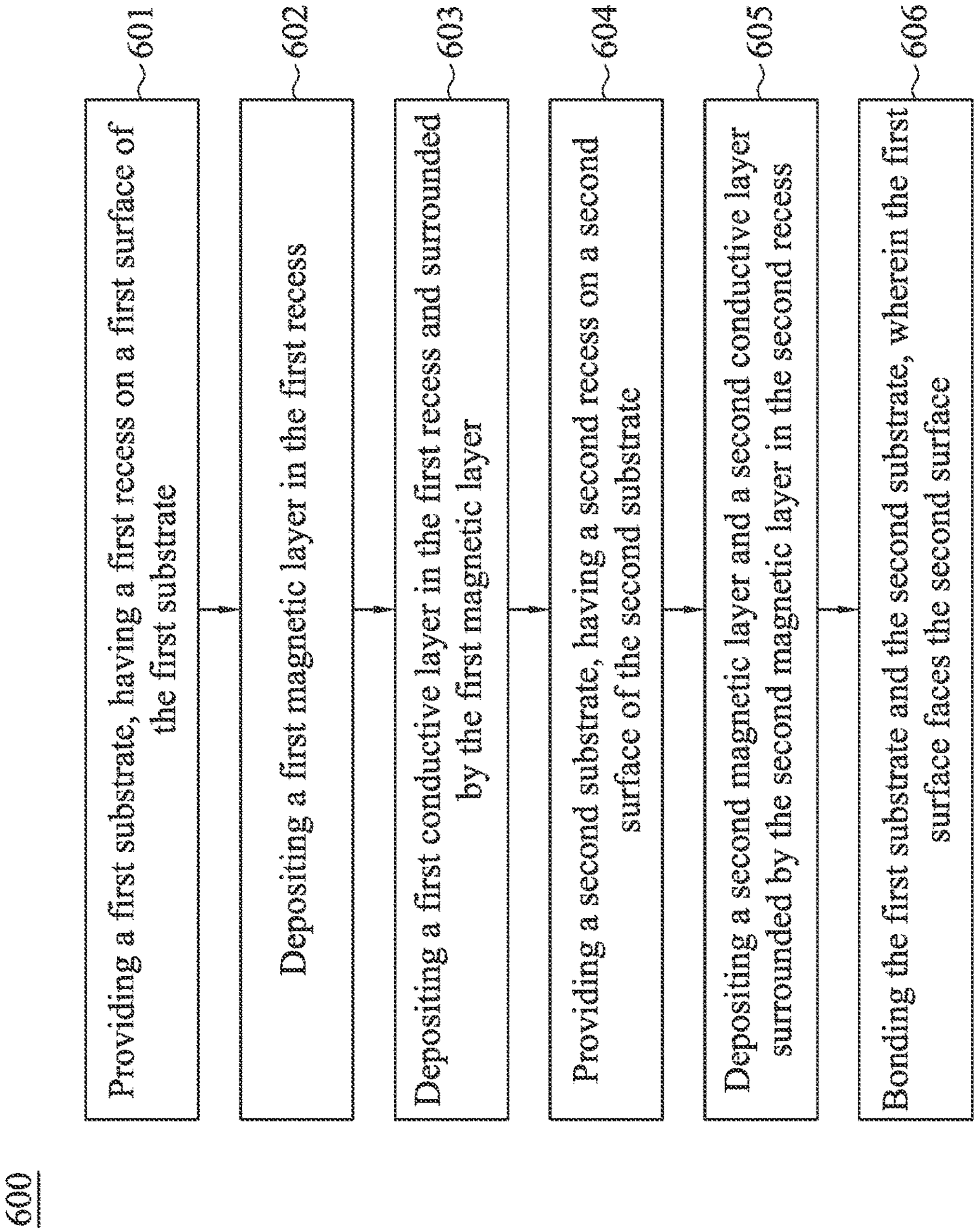
FIG. 36 is a flow diagram of a method of manufacturing a semiconductor structure in accordance with different embodiments of the present disclosure.

FIG. 36 is a flow diagram of the method 600 for manufacturing a semiconductor structure in accordance with some embodiments of the present disclosure. The method 600 includes a number of operations (601, 602, 603, 604, 605 and 606) and the description and illustration are not deemed as a limitation to the sequence of the operations. In the operation 601, a first substrate is provided, wherein the first substrate includes a first recess on a first surface of the first substrate. In the operation 602, a first magnetic layer is deposited in the first recess. In the operation 603, a first conductive layer is deposited in the first recess, wherein the first conductive layer is surrounded by the first magnetic layer. In the operation 604, a second substrate is provided, wherein the second substrate includes a second recess on a second surface of the second substrate. In the operation 605, a second magnetic layer and a second conductive layer are deposited in the second recess, wherein the second conductive layer is surrounded by the second magnetic layer in the second recess. In the operation 606, the first substrate and the second substrate are bonded, wherein the first surface faces the second surface. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

In a conventional inductor, horizontally arranged metal lines extend along a surface of a semiconductor wafer in a horizontal direction in order to achieve a lower manufacturing cost and ease of control, and thus a size or a coverage area of the conventional inductor is limited and cannot be further reduced. The present disclosure provides an inductor structure having vertically arranged conductive materials. The vertical arrangement of the conductive materials can reduce a coverage area of the inductor structure over a semiconductor substrate (including a circuit formed therewithin). In addition, compared to the conventional inductor, the conductive material of the inductor structure of the present disclosure extends along a vertical direction instead, and the coverage area of the inductor structure is further reduced. In some embodiments, a coverage area of the inductor structure is reduced by 75% compared to a conventional inductor.

It should be noted that an annealing operation is commonly used to adjust a magnetic property of a magnetic material. For instance, an annealing operation can be performed on the structures 101 to 109 prior to the bonding operation for a purpose of magnetic phase transformation (e.g., transformation to a paramagnetic phase). In some embodiments, a temperature of the annealing operation is greater than 300 degrees Celsius (° C.). The high temperature of the annealing operation may affect an electrical property of the circuit or electrical elements of the semiconductor wafer as in the conventional inductor. The inductor structure of the present disclosure includes an upper conductive material and a lower conductive material formed individually in different wafers and then bonded together. The annealing operation can be performed on individual structures 101 to 109 prior to bonding with a semiconductor substrate (e.g., 301 in FIG. 34), and thus an electrical property of the circuit or electrical elements of the semiconductor substrate are not affected. A product yield can be thereby improved.

In accordance with some embodiments of the disclosure, a semiconductor structure is provided. The semiconductor structure includes a first semiconductor substrate, a first conductive layer, a first magnetic layer, and a second magnetic layer. The first semiconductor substrate has a top surface, and the first conductive layer is vertically inserted into the first semiconductor substrate from the top surface of the first semiconductor substrate. The first magnetic layer is disposed in the first semiconductor substrate and surrounds the first conductive layer. The second magnetic layer is disposed over the first conductive layer and the first magnetic layer.

In accordance with some embodiments of the disclosure, a semiconductor structure is provided. The semiconductor structure includes a first inductor, a second inductor, and a dielectric layer. The first inductor is vertically inserted in a first semiconductor layer, wherein the first inductor includes a first conductive layer and a first magnetic layer surrounding the first conductive layer. The second inductor is disposed in a second semiconductor layer, wherein the second semiconductor layer is disposed over the first semiconductor layer, and the second inductor includes a second conductive layer and a second magnetic layer surrounding the second conductive layer, wherein the first inductor and the second inductor are vertically aligned. The dielectric layer is disposed between the first conductive layer and the second conductive layer and separates the first inductor from the second inductor.

In accordance with some embodiments of the disclosure, a method for manufacturing a semiconductor structure is provided. The method may include several operations. A first substrate is provided, wherein the first substrate includes a first recess on a first surface of the first substrate. A first magnetic layer is deposited in the first recess. A first conductive layer is deposited in the first recess and surrounded by the first magnetic layer. A second substrate is provided, wherein the second substrate includes a second recess on a second surface of the second substrate. A second magnetic layer and a second conductive layer are deposited in the second recess, wherein the second conductive layer is surrounded by the second magnetic layer in the second recess. The first substrate and the second substrate are bonded, wherein the first surface faces the second surface.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first substrate, having a top surface;

a first conductive layer, vertically inserted into the first substrate from the top surface of the first substrate;

a first magnetic layer, disposed in the first substrate and surrounding the first conductive layer;

a second magnetic layer, disposed over the first conductive layer and the first magnetic layer; and a first dielectric material, disposed over the first magnetic layer, wherein a portion of the first dielectric material separates the second magnetic layer into a first portion and a second portion at a location vertically overlapping the first conductive layer, and the portion of the first dielectric material and the first portion and the second portion of the second magnetic layer are arranged along a direction substantially parallel to an extending direction of the first substrate.

2. The semiconductor structure of claim 1, further comprising:

a second substrate, bonded to the first substrate over the top surface of the first substrate;

a second conductive layer, vertically inserted into the second substrate and aligned with the first conductive layer; and a third magnetic layer, disposed in the second substrate and surrounding the second conductive layer.

3. The semiconductor structure of claim 2, wherein the second magnetic layer is disposed between the first conductive layer and the second conductive layer.

4. The semiconductor structure of claim 1, further comprising a second dielectric material between the first magnetic layer and the second magnetic layer.

5. The semiconductor structure of claim 1, further comprising a dielectric layer separating the first magnetic layer from the first conductive layer.

6. The semiconductor structure of claim 5, wherein the dielectric layer further separates the first magnetic layer from the second magnetic layer.

7. The semiconductor structure of claim 1, wherein a portion of the first conductive layer protrudes from the top surface of the first substrate.

8. A semiconductor structure, comprising:

a first inductor, vertically inserted in a first semiconductor layer, the first inductor including a first conductive layer and a first magnetic layer surrounding the first conductive layer;

a second inductor, disposed in a second semiconductor layer, the second semiconductor layer disposed over the first semiconductor layer, and the second inductor including a second conductive layer and a second magnetic layer surrounding the second conductive layer, wherein the first inductor and the second inductor are vertically aligned; and a dielectric layer, disposed between the first conductive layer and the second conductive layer and separating the first inductor from the second inductor.

9. The semiconductor structure of claim 8, wherein the first magnetic layer has a U shape in a cross-sectional view.

10. The semiconductor structure of claim 8, further comprising:

a third magnetic layer, disposed between the first inductor and the second inductor and overlapping at least a portion of the first conductive layer or at least a portion of the second conductive layer.

11. The semiconductor structure of claim 10, wherein the third magnetic layer overlaps an entirety of the first inductor or an entirety of the second inductor.

12. The semiconductor structure of claim 10, wherein the third magnetic layer is in contact with at least one of the first magnetic layer and the second magnetic layer.

13. The semiconductor structure of claim 8, wherein a portion of the first magnetic layer is disposed over a top surface of the first semiconductor layer.

14. The semiconductor structure of claim 8, wherein a top surface of the first conductive layer is substantially aligned with a top surface of the first magnetic layer.

15. The semiconductor structure of claim 8, further comprising:

a connecting structure, penetrating the second semiconductor layer and electrically connected to the first conductive layer.

16. The semiconductor structure of claim 8, further comprising:

a conductive pad, disposed over the second semiconductor layer opposite to the first semiconductor layer and electrically connected to the first conductive layer.

17. A method of manufacturing a semiconductor structure, comprising:

providing a first substrate, having a first recess on a first surface of the first substrate;

depositing a first magnetic layer in the first recess;

depositing a first conductive layer in the first recess and surrounded by the first magnetic layer;

providing a second substrate, having a second recess on a second surface of the second substrate;

depositing a second magnetic layer and a second conductive layer surrounded by the second magnetic layer in the second recess; and bonding the first substrate to the second substrate, wherein the first surface faces the second surface.

18. The method of claim 17, further comprising:

depositing a first dielectric layer in the first recess prior to the depositing of the first magnetic layer; and depositing a second dielectric layer after the depositing of the first magnetic layer and prior to the depositing of the first conductive layer.

19. The method of claim 17, further comprising:

bonding the first substrate to a third substrate opposite to the second substrate, wherein the third substrate includes at least a transistor.

20. The method of claim 17, wherein the depositing of the first conductive layer comprises performing a plating operation.

* * * * *